(12) United States Patent
Yoon et al.

(10) Patent No.: US 11,145,798 B2
(45) Date of Patent: Oct. 12, 2021

(54) DISPLAY APPARATUS

(71) Applicant: Seoul National University R&DB Foundation, Seoul (KR)

(72) Inventors: Euijoon Yoon, Seoul (KR); Seungmin Lee, Seoul (KR); Jongmyeong Kim, Anyang-si (KR)

(73) Assignee: Seoul National University R&DB Foundation (KR)

( * ) Notice: Subject to any disclaimer, the term of this patent is extended or adjusted under 35 U.S.C. 154(b) by 0 days.

(21) Appl. No.: 16/524,128

(22) Filed: Jul. 28, 2019

(65) Prior Publication Data

US 2020/0035890 A1 Jan. 30, 2020

(30) Foreign Application Priority Data

Jul. 27, 2018 (KR) .................... 10-2018-0087962

(51) Int. Cl.
*H01L 33/62* (2010.01)
*H01L 27/15* (2006.01)
(Continued)

(52) U.S. Cl.
CPC ............ *H01L 33/62* (2013.01); *H01L 27/156* (2013.01); *H01L 33/483* (2013.01); *H01L 33/60* (2013.01)

(58) Field of Classification Search
CPC ....... H01L 27/153; H01L 33/62; H01L 33/24; H01L 33/60; H01L 25/0753; H01L 33/46
See application file for complete search history.

(56) References Cited

U.S. PATENT DOCUMENTS 6,613,610 B2 9/2003 Iwafuchi et al.
7,205,168 B2 4/2007 Oohata et al.
(Continued)

FOREIGN PATENT DOCUMENTS

CN 106688113 A 5/2017
DE 112012002182 4/2014
(Continued)

OTHER PUBLICATIONS

K. Ding, V. Avrutin, N. Izyumskaya, S. Metzner, F. Bertram, J. Christen, U. Ozgur, H. Morkoc, "Recent progress in nonpolar and semi-polar GaN light emitters on patterned Si substrates,", Feb. 23, 2018. Proc. SPIE 10532, Gallium Nitride Materials and Devices XIII, 1053208. (Year: 2018).*

(Continued)

*Primary Examiner* — Changhyun Yi
(74) *Attorney, Agent, or Firm* — Renaissance IP Law Group LLP

(57) ABSTRACT

Disclosed is a display apparatus comprising a plurality of pixels and a light emitting device on each of the plurality of pixels. The light emitting device includes a first semiconductor layer, an active layer, and a second semiconductor layer that are sequentially stacked on a bottom surface and a sidewall of the light emitting device. The sidewall of the light emitting device includes a first facet and a second facet adjacent to the first facet. A first angle is made between the bottom surface and the first facet. A second angle is made between the bottom surface and the second facet. The first facet and the second facet meet each other to define an edge. The edge extends from the bottom surface toward a top surface of the light emitting device.

17 Claims, 39 Drawing Sheets

(51) Int. Cl.
　　*H01L 33/48*　　(2010.01)
　　*H01L 33/60*　　(2010.01)

(56) References Cited

U.S. PATENT DOCUMENTS

| | | | |
|---|---|---|---|
| 7,939,841 | B2 | 5/2011 | Lee et al. |
| 8,686,447 | B2 | 4/2014 | Tomoda et al. |
| 8,865,495 | B2 | 10/2014 | Xu et al. |
| 8,921,141 | B2 | 12/2014 | Kryliouk et al. |
| 8,928,004 | B2 | 1/2015 | Choe et al. |
| 8,941,215 | B2 | 1/2015 | Hu et al. |
| 9,484,492 | B2 | 11/2016 | Bour et al. |
| 9,793,359 | B2 | 10/2017 | Yoon et al. |
| 2004/0266043 | A1 | 12/2004 | Oohata et al. |
| 2007/0085087 | A1* | 4/2007 | Okuyama ......... H01L 21/02546 257/79 |
| 2010/0078670 | A1 | 4/2010 | Kim et al. |
| 2014/0361321 | A1 | 12/2014 | Saito et al. |
| 2015/0263066 | A1 | 9/2015 | Hu et al. |
| 2017/0271556 | A1 | 9/2017 | Yoon et al. |
| 2017/0309678 | A1 | 10/2017 | Yang et al. |
| 2017/0331008 | A1 | 11/2017 | Wang |
| 2019/0088820 | A1* | 3/2019 | Danesh ................ H01L 33/32 |

FOREIGN PATENT DOCUMENTS

| | | | |
|---|---|---|---|
| DE | 112015003254 | | 6/2017 |
| EP | 2341530 | A1 | 7/2011 |
| JP | 2006339551 | A | 12/2006 |
| JP | 2010283399 | A | 12/2010 |
| JP | 2013179368 | A | 9/2013 |
| JP | 5671982 | B2 | 2/2015 |
| JP | 2015162566 | A | 9/2015 |
| JP | 5944489 | B2 | 7/2016 |
| JP | 2017524268 | A | 8/2017 |
| KR | 20050039734 | A | 4/2005 |
| KR | 20050066358 | A | 6/2005 |
| KR | 20060077801 | A | 7/2006 |
| KR | 20090086781 | A | 8/2009 |
| KR | 20110085726 | A | 7/2011 |
| KR | 20120099585 | A | 9/2012 |
| KR | 101235239 | B1 | 2/2013 |
| KR | 101557083 | B1 | 10/2015 |
| KR | 101809252 | B1 | 12/2017 |
| TW | I557939 | B | 11/2016 |
| WO | 2012161451 | A2 | 11/2012 |
| WO | 2016010323 | A1 | 1/2016 |
| WO | 2016111789 | A1 | 7/2016 |
| WO | 2019199946 | A1 | 10/2019 |

OTHER PUBLICATIONS

Jang, Jeonghwan et al., "Incorporation of air-cavity into sapphire substrate and its effect on GaN growth and optical properties", Journal of Crystal Growth, vol. 430, pp. 41-45, 2015.

Kim, Jonghak et al., "Less strained and more efficient GaN light-emitting diodes with embedded silica hollow nanospheres", Scientific Reports, vol. 3, pp. 1-7, 2013.

Lee, Donghyun et al., "Improved performance of AlGaN-based deep ultraviolet light-emitting diodes with nano-patterned AlN/sapphire substrates", Applied Physics Letters, vol. 110, pp. 191103-1-191103-5, 2017.

Moon, Daeyoung et al., "An ultra-thin compliant sapphire membrane for the growth of less strained, less defective GaN", Journal of Crystal Growth, vol. 441, pp. 52-57, 2016.

Moon, Yoon-Jong, et al., "Microstructured Air Cavities as High-Index Contrast Substrates with Strong Diffraction for Light-Emitting Diodes", Nano Letters, vol. 16, pp. 3301-3308, 2016.

* cited by examiner

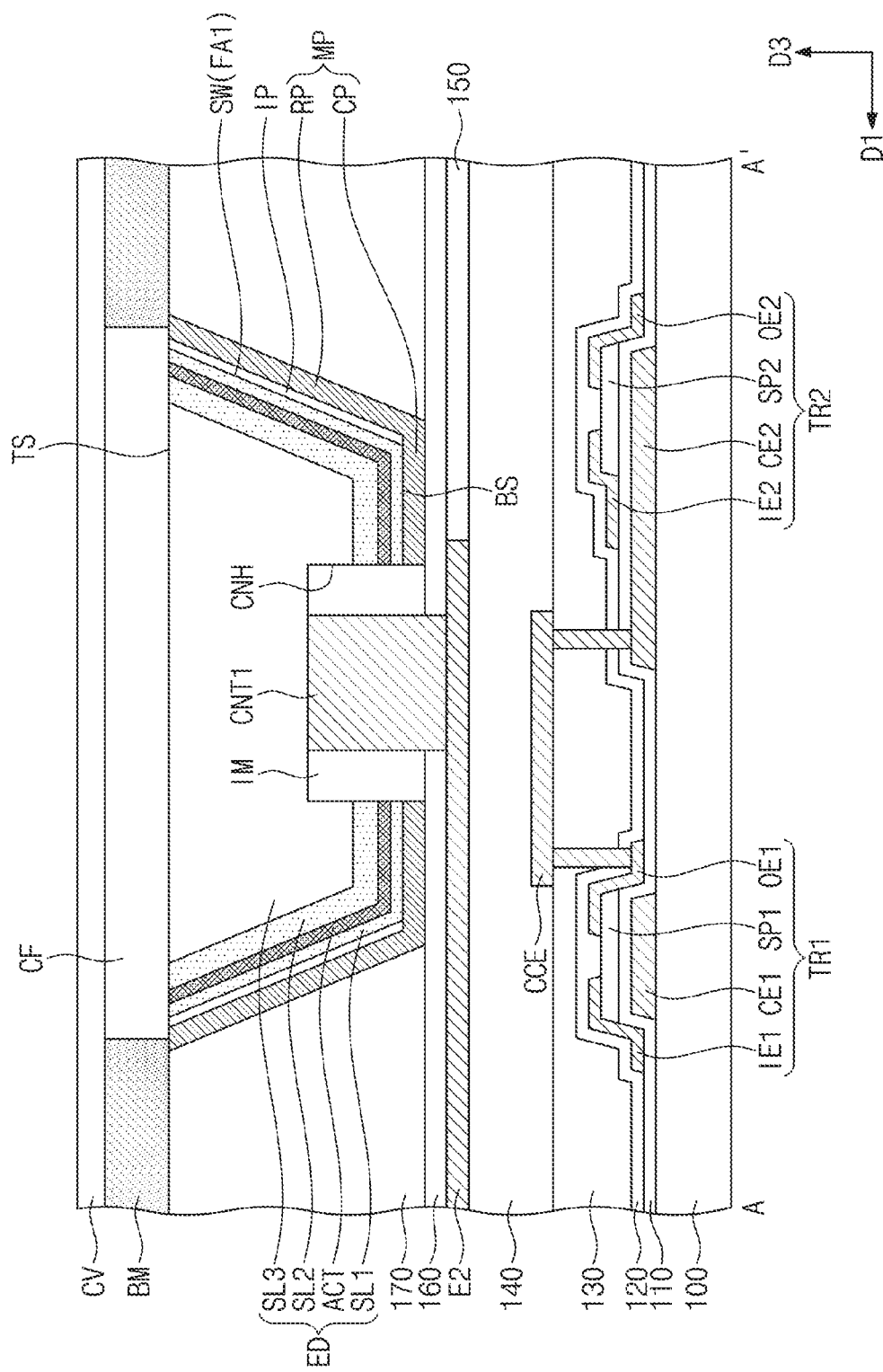

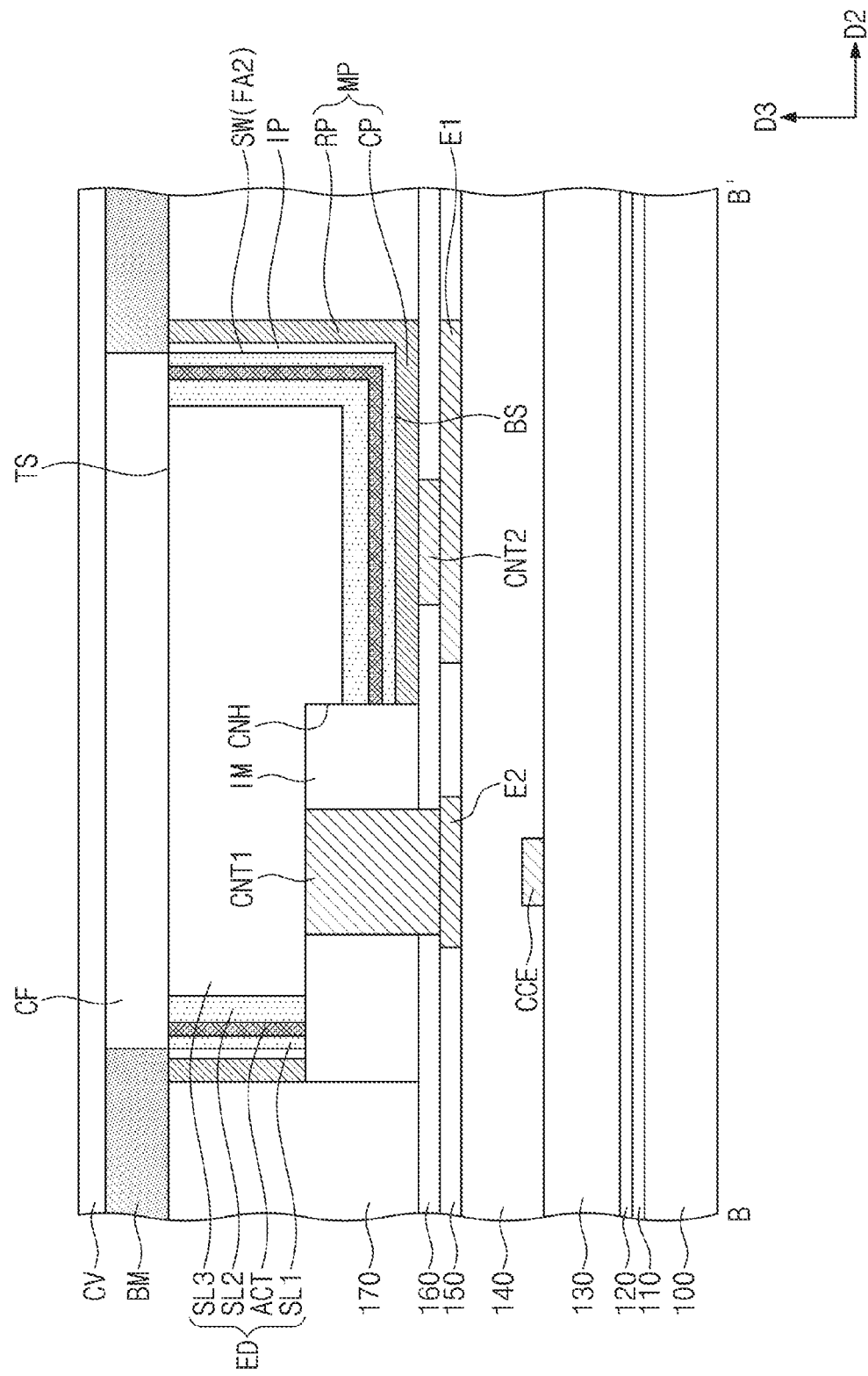

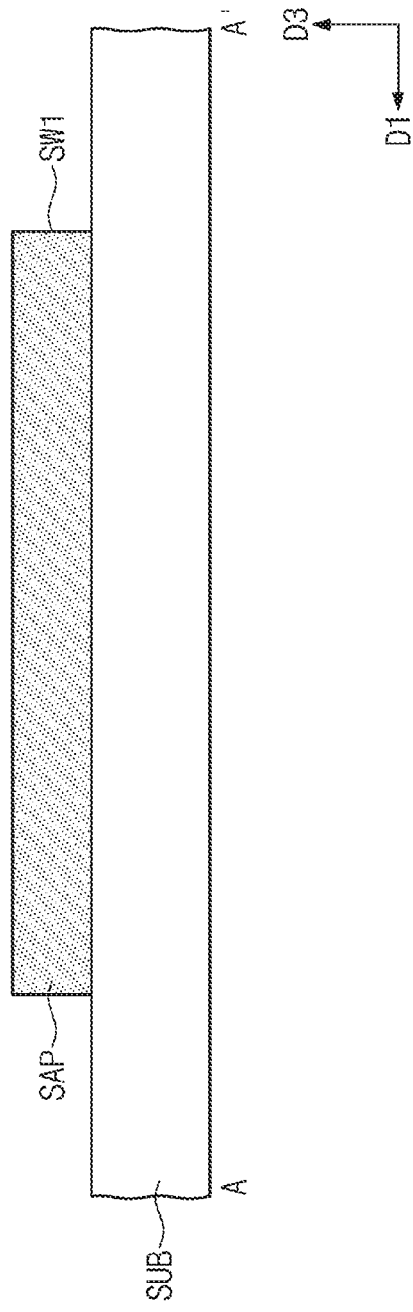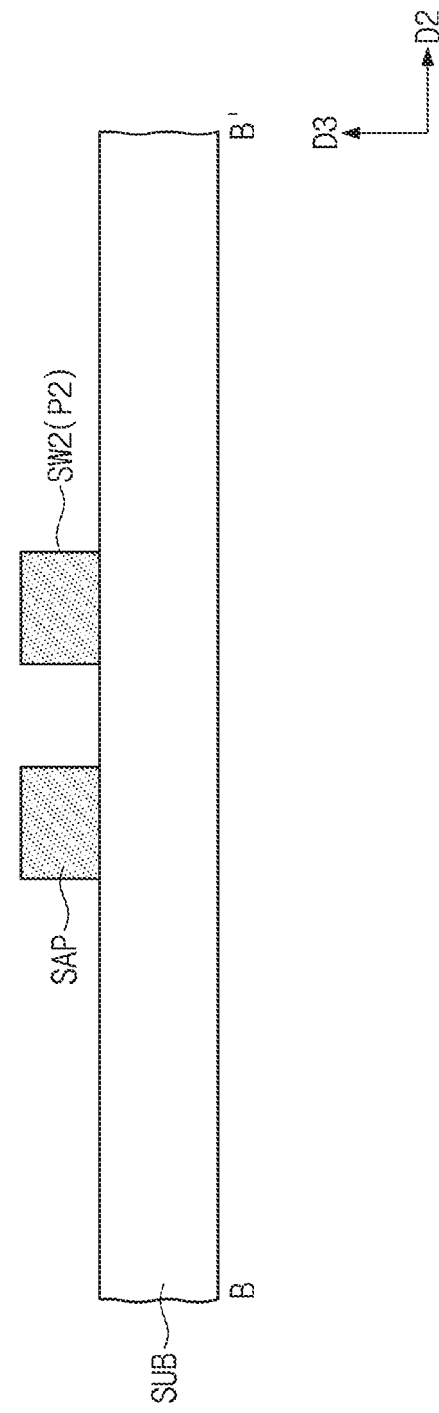

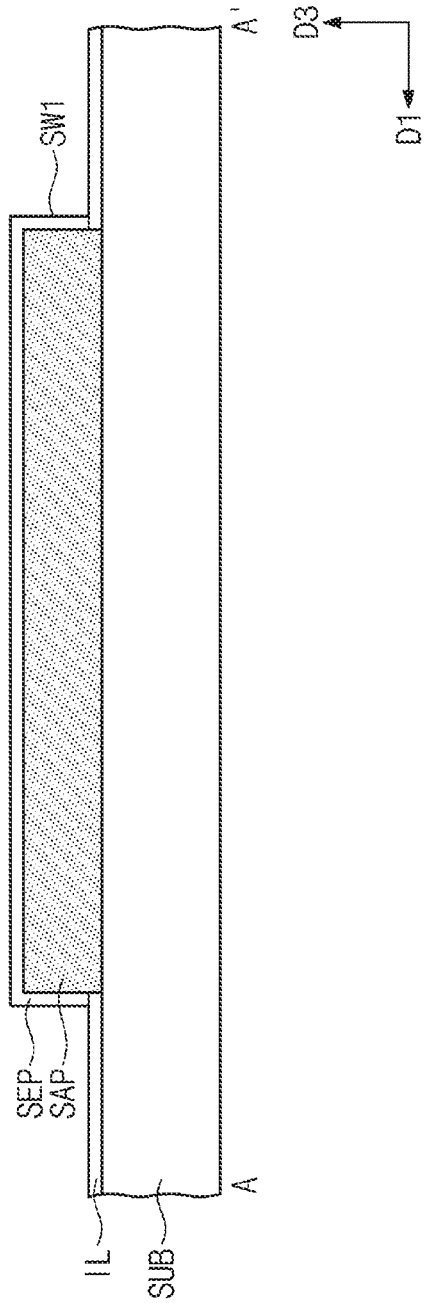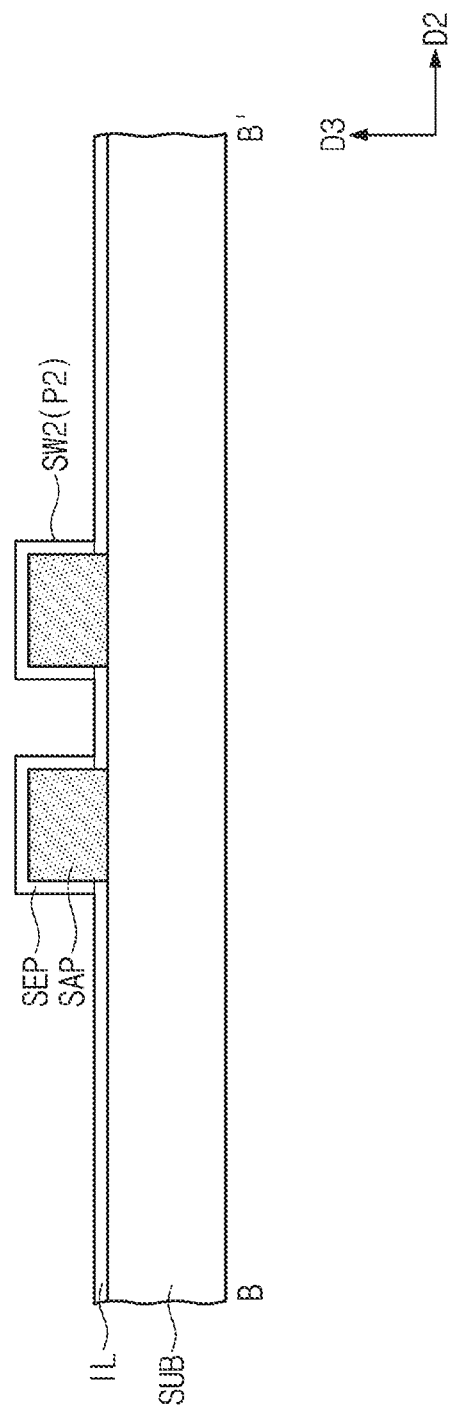

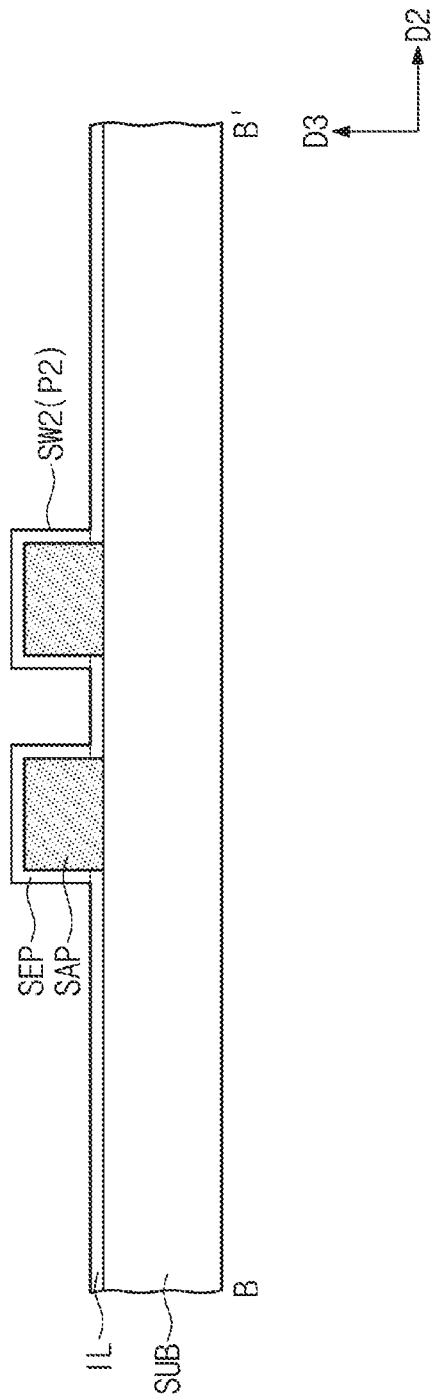

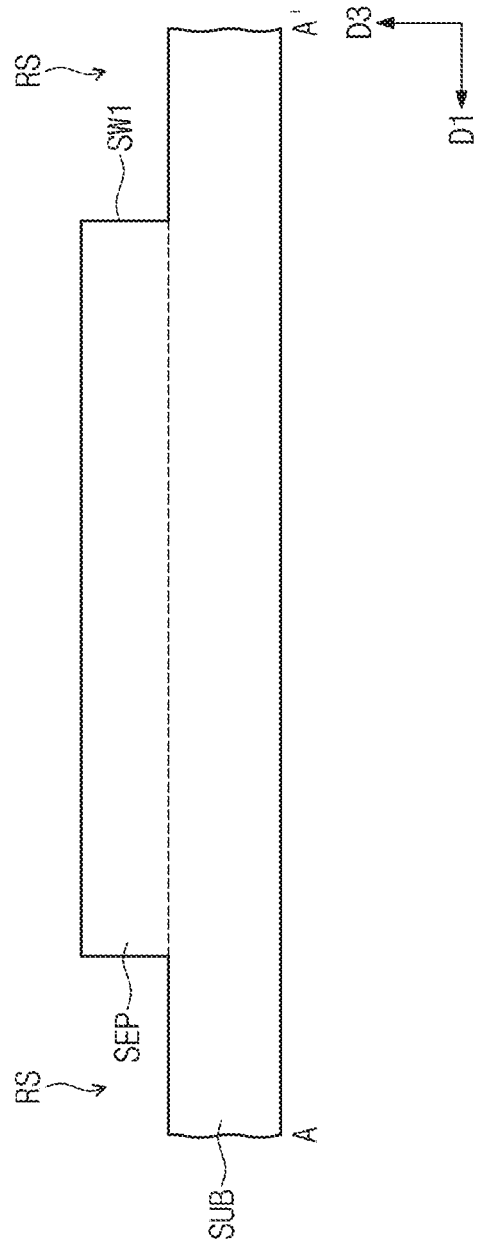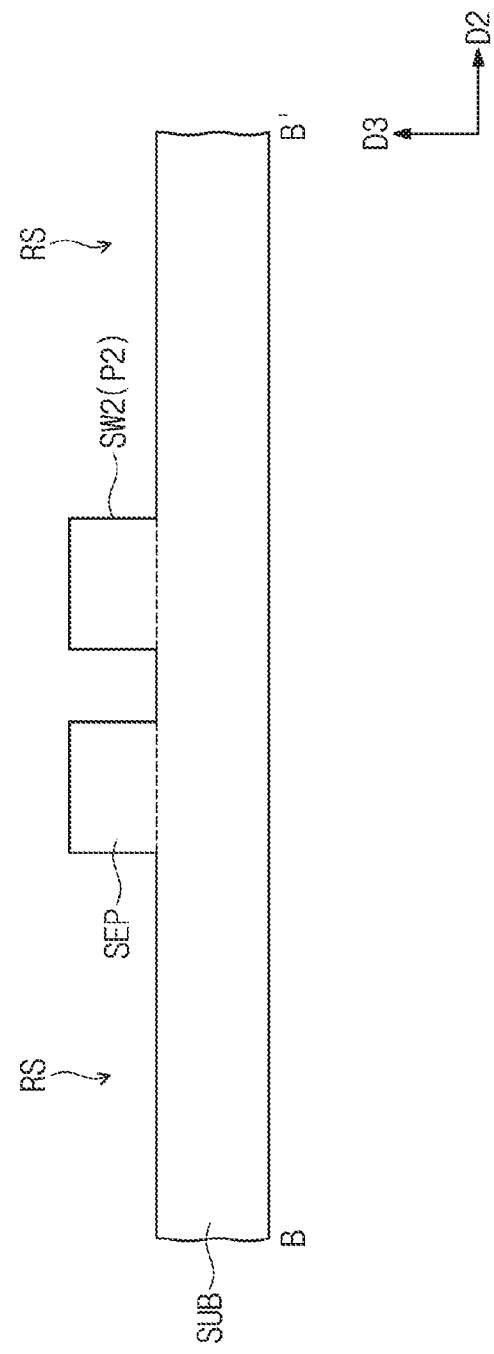

DISPLAY APPARATUS

CROSS-REFERENCE TO RELATED APPLICATION

This U.S. nonprovisional application claims priority under 35 U.S.C § 119 to Korean Patent Application No. 10-2018-0087962 filed on Jul. 27, 2018 in the Korean Intellectual Property Office, the entire contents of which are hereby incorporated by reference.

BACKGROUND

The present inventive concepts relate to a display apparatus with increased luminance efficiency and a method of fabricating the same.

Display apparatuses include light emitting devices. The light emitting device may be electrically connected to an electrode, and may emit by a voltage applied to the electrode. The light emitting device may be directly formed on the electrode, or may be separately formed and then disposed on the electrode.

The light emitting device may be a light emitting diode (LED). The LED is a semiconductor device in which a forward voltage is applied to a PN junction diode and then energy resulting from recombination of hole-electron is converted into light. The LED may be formed as an inorganic or organic LED. The LED may be used not only in small electronic products such as cell phones, but in large-sized TV sets.

SUMMARY

Some example embodiments of the present inventive concepts provide a display apparatus with increased luminance efficiency and a method of fabricating the same.

According to some example embodiments of the present inventive concepts, a display apparatus may comprise: a plurality of pixels; and a light emitting device on each of the plurality of pixels. The light emitting device may include a first semiconductor layer, an active layer, and a second semiconductor layer that are sequentially stacked on a bottom surface and a sidewall of the light emitting device. The sidewall of the light emitting device may include a first facet and a second facet adjacent to the first facet. A first angle may be made between the bottom surface and the first facet. A second angle may be made between the bottom surface and the second facet. The first facet and the second facet may meet each other to define an edge. The edge may extend from the bottom surface toward a top surface of the light emitting device.

According to some example embodiments of the present inventive concepts, a display apparatus may comprise: a plurality of pixels; a light emitting device on each of the plurality of pixels; and a conductive structure including a reflection pattern on a sidewall of the light emitting device and a connection pattern on a bottom surface of the light emitting device. The light emitting device may include a first semiconductor layer, an active layer, and a second semiconductor layer that are sequentially stacked on the bottom surface and the sidewall. The reflection pattern may be spaced apart from the sidewall. The connection pattern may be electrically connected to the first semiconductor layer on the bottom surface.

According to some example embodiments of the present inventive concepts, a display apparatus may comprise: a plurality of pixels on a base layer; and a light emitting device on each of the plurality of pixels. The light emitting device may include a first semiconductor layer, an active layer, and a second semiconductor layer that are sequentially stacked. The light emitting device may have a first width in a first direction and a second width in a second direction intersecting the first direction. The first width at a first level may be less than the first width at a second level higher than the first level. A first difference may be provided between the first width at the second level and the first width at the first level. A second difference may be provided between the second width at the second level and the second width at the first level.

BRIEF DESCRIPTION OF THE DRAWINGS

FIGS. 6A and 6B illustrate cross-sectional views respectively taken along lines A-A' and B-B' of FIG. 3, showing a display apparatus according to some example embodiments of the present inventive concepts.

FIGS. 8A, 10A, 12A, and 14A illustrate cross-sectional views taken along line A-A' of FIGS. 7, 9, 11, and 13, respectively.

FIGS. 8B, 10B, 12B, and 14B illustrate cross-sectional views taken along line B-B' of FIGS. 7, 9, 11, and 13, respectively.

FIGS. 21A and 21B illustrate cross-sectional views respectively taken along lines A-A' and B-B' of FIG. 20.

FIGS. 26A and 26B illustrate cross-sectional views respectively taken along lines A-A' and B-B' of FIG. 25.

DETAILED DESCRIPTION OF EMBODIMENTS

Figure 1:
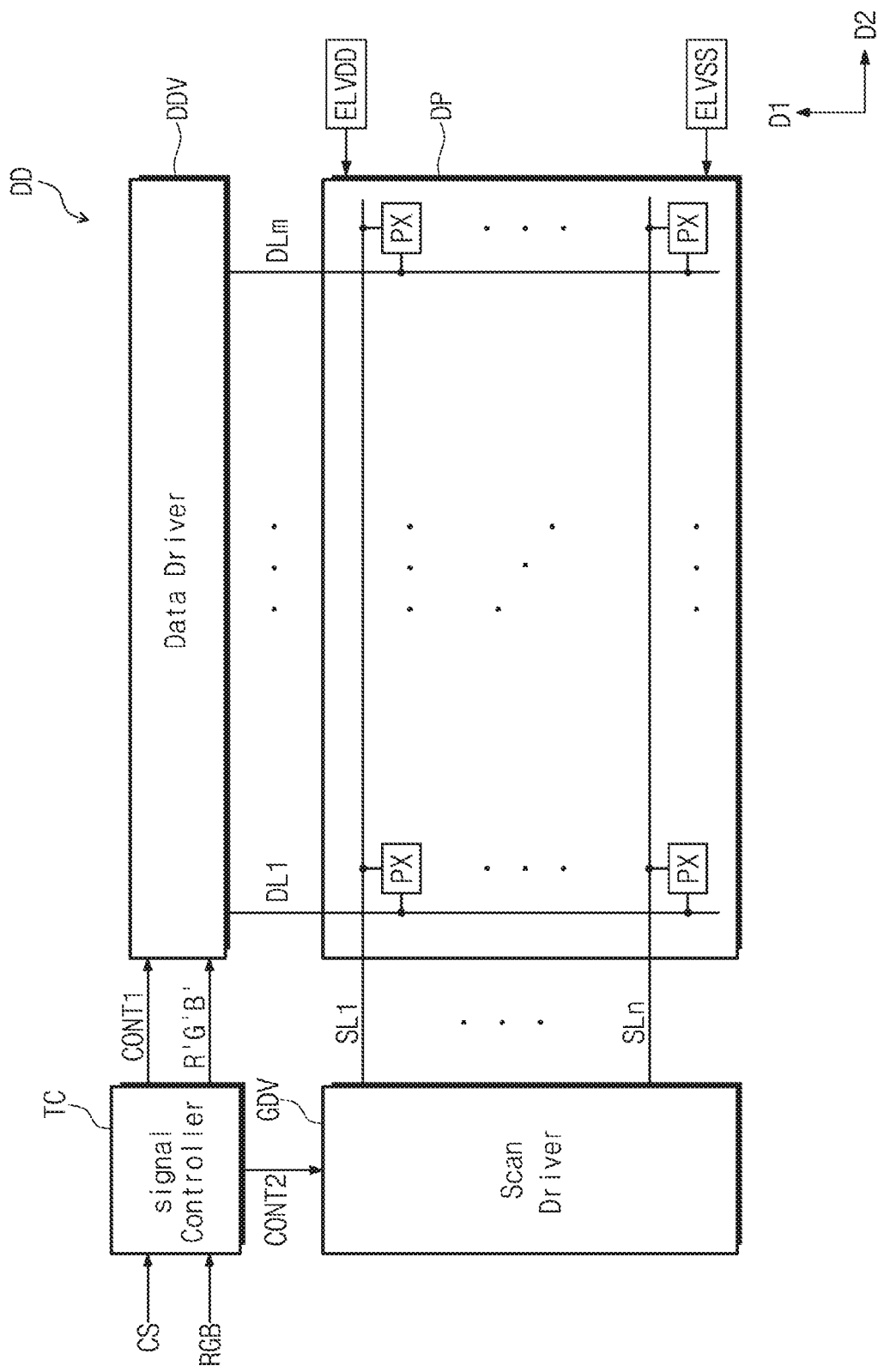
FIG. 1 illustrates a block diagram showing a display apparatus according to some example embodiments of the present inventive concepts.

In order to sufficiently understand the configuration and effect of the present inventive concepts, some example embodiments of the present inventive concepts will be described with reference to the accompanying drawings. It should be noted, however, that the present inventive concepts are not limited to the following exemplary embodiments, and may be implemented in various forms. Rather, the exemplary embodiments are provided only to disclose the present inventive concepts and let those skilled in the art fully know the scope of the present inventive concepts.

In this description, it will be understood that, when an element is referred to as being on another element, the element can be directly on the other element or intervening elements may be present therebetween. In the drawings, thicknesses of some components are exaggerated for effectively explaining the technical contents. Like reference numerals refer to like elements throughout the specification.

Some example embodiments detailed in this description will be discussed with reference to sectional and/or plan views as ideal exemplary views of the present inventive concepts. In the drawings, thicknesses of layers and regions are exaggerated for effectively explaining the technical contents. Accordingly, regions exemplarily illustrated in the drawings have general properties, and shapes of regions exemplarily illustrated in the drawings are used to exemplarily disclose specific shapes but not limited to the scope of the present inventive concepts. It will be understood that, although the terms "first", "second", "third", etc. may be used herein to describe various elements, these elements should not be limited by these terms. These terms are only used to distinguish one element from another element. The some example embodiments explained and illustrated herein include complementary embodiments thereof.

The terminology used herein is for the purpose of describing particular embodiments only and is not intended to limit the present inventive concepts. As used herein, the singular forms are intended to include the plural forms as well. The terms 'comprises/includes' and/or 'comprising/including' used in the specification do not exclude the presence or addition of one or more other components.

FIG. 1 illustrates a block diagram showing a display apparatus according to some example embodiments of the present inventive concepts.

Referring to FIG. 1, a display apparatus DD may include a display panel DP, a signal controller TC (or a timing controller), a data driver DDV, and a scan driver GDV. A circuit may be included in each of the signal controller TC, the data driver DDV, and the scan driver GDV.

The display panel DP may include a light emitting device. For example, the display panel DP may include a micro-LED. The display panel DP may include a plurality of data lines DL1 to DLm, a plurality of scan lines SL1 to SLn, and a plurality of pixels PX.

The plurality of data lines DL1 to DLm may extend in a first direction D1. The plurality of data lines DL1 to DLm may be arranged along a second direction D2 intersecting the first direction D1. The plurality of scan lines SL1 to SLn may extend in the second direction D2. The plurality of scan lines SL1 to SLn may be arranged in the first direction D1.

Each of the pixels PX may include a light emitting device and a pixel circuit electrically connected to the light emitting device. The pixel circuit may include a plurality of transistors. A first power voltage ELVDD and a second power voltage ELVSS may be provided to each of the pixels PX.

The pixels PX may be regularly disposed on a flat surface of the display panel DP. Each of the pixels PX may display one of primary colors or one of mixed colors. The primary colors may include red, green, and blue. The mixed colors may include yellow, cyan, magenta, and white. However, the colors displayed on the pixels PX are not limited thereto.

The signal controller TC may receive an image data RGB externally provided. The signal controller TC may produce a converted image data R'G'B' by converting the image data RGB to coincide with operation of the display panel DP, and may output the converted image data R'G'B' to the data driver DDV.

The signal controller TC may receive a control signal CS externally provided. The control signal CS may include a vertical synchronizing signal, a horizontal synchronizing signal, a main clock signal, and a data enable signal. The signal controller TC may provide the data driver DDV with a first control signal CONT1 and provide the scan driver GDV with a second control signal CONT2. The first control signal CONT1 may be a signal for controlling the data driver DDV, and the second control signal CONT2 may be a signal for controlling the scan driver GDV.

The plurality of data lines DL1 to DLm may be driven by the data driver DDV in response to the first control signal CONT1 provided from the signal controller TC. The data driver DDV may be achieved in the form of an individual integrated circuit, and may be electrically connected to one side of the display panel DP or directly mounted on the display panel DP. Alternatively or additionally, the data driver DDV may be achieved in the form of a single chip or may include a plurality of chips.

The plurality of scan lines SL1 to SLn may be driven by the scan driver GDV in response to the second control signal CONT2 provided from the signal controller TC. For example, the scan driver GDV may be integrated on a single region of the display panel DP. In this case, the scan driver GDV may include a plurality of thin film transistors formed by one of a low temperature polycrystalline silicon (LTPS) process and a low temperature polycrystalline oxide (LTPO) process that are the same as that used for forming a driver circuit for driving the pixels PX. For another example, the scan driver GDV may be achieved in the form of an individual integrated circuit chip and may be electrically connected to one side of the display panel DP.

While one of the plurality of scan lines SL1 to SLn is supplied with a gate-on voltage, a switching transistor may be turned on which is included in each of pixels on one row connected to the one scan line. In this case, the data driver DDV may provide the data lines DL1 to DLm with data drive signals. The data drive signals provided to the data lines DL1 to DLm may be applied through the turned-on switching transistor to corresponding pixels. The data drive signals may be analog voltages corresponding to gray scales of image data.

Figure 2:
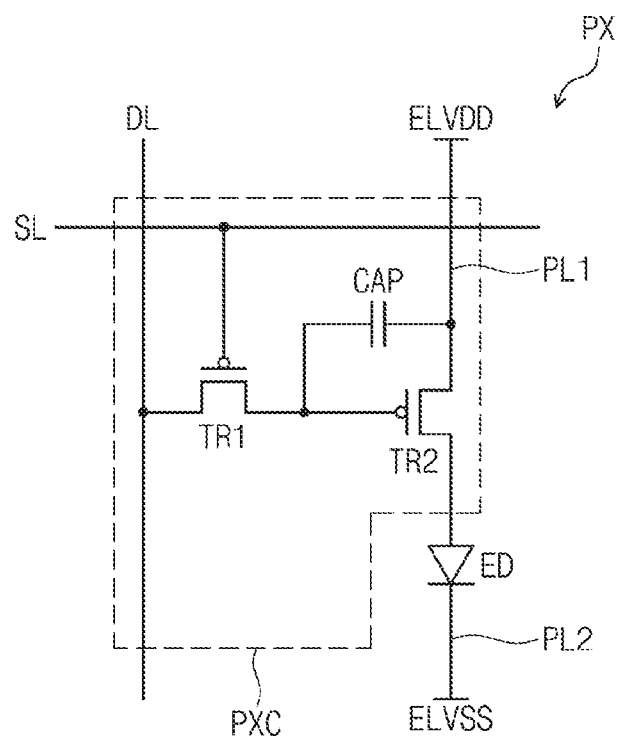
FIG. 2 illustrates an equivalent circuit diagram showing a pixel according to some example embodiments of the present inventive concepts.

FIG. 2 illustrates an equivalent circuit diagram showing a pixel according to some example embodiments of the present inventive concepts.

Referring to FIG. 2, a pixel PX may be connected to a plurality of signal lines. The signal lines according to some example embodiments of the present inventive concepts may include a scan line SL, a data line DL, a first power line PL1, and a second power line PL2.

The pixel PX may include a light emitting device ED and a pixel circuit PXC. The pixel circuit PXC may include a first thin film transistor TR1, a capacitor CAP, and a second thin film transistor TR2.

The first thin film transistor TR1 may be a switching transistor that controls on/off of the pixel PX. In response to a gate signal transmitted through the scan line SL, the first thin film transistor TR1 may transfer or block a data signal transmitted through the data line DL.

The capacitor CAP may be connected between the first thin film transistor TR1 and the first power line PL1. The capacitor CAP may be electrically charged due to a difference in voltage between the data signal transmitted from the first thin film transistor TR1 and the first power voltage ELVDD applied to the first power line PL1.

The second thin film transistor TR2 may be connected to the first thin film transistor TR1, the capacitor CAP, and the light emitting device ED. In response to a charged amount of the capacitor CAP, the second thin film transistor TR2 may control a drive current that flows through the light emitting device ED. A turned-on time of the second thin film transistor TR2 may be determined in accordance with the charged amount of the capacitor CAP.

The first thin film transistor TR1 and the second thin film transistor TR2 may be an n-type thin film transistor or a p-type thin film transistor. Alternatively, in other embodiments, one of the first thin film transistor TR1 and the second thin film transistor TR2 may be an n-type thin film transistor, and the other of the first thin film transistor TR1 and the second thin film transistor TR2 may be a p-type thin film transistor.

The light emitting device ED may be connected between the second thin film transistor TR2 and the second power line PL2. The light emitting device ED may emit light by a difference in voltage between a signal transmitted through the second thin film transistor TR2 and the second power voltage ELVSS received through the second power line PL2.

The light emitting device ED may be an ultra small LED device. The ultra small LED device may be an LED device whose size is in a range from several nano-meters to several hundreds of micro-meters. The size of the ultra small LED device is merely illustrative example, and is not limited to the aforementioned size range.

FIG. 2 exemplarily shows a single light emitting device ED connected between the second thin film transistor TR2 and the second power line PL2, but the light emitting device ED may be provided in plural. The plurality of light emitting devices ED may be connected in parallel to each other.

Figure 3:
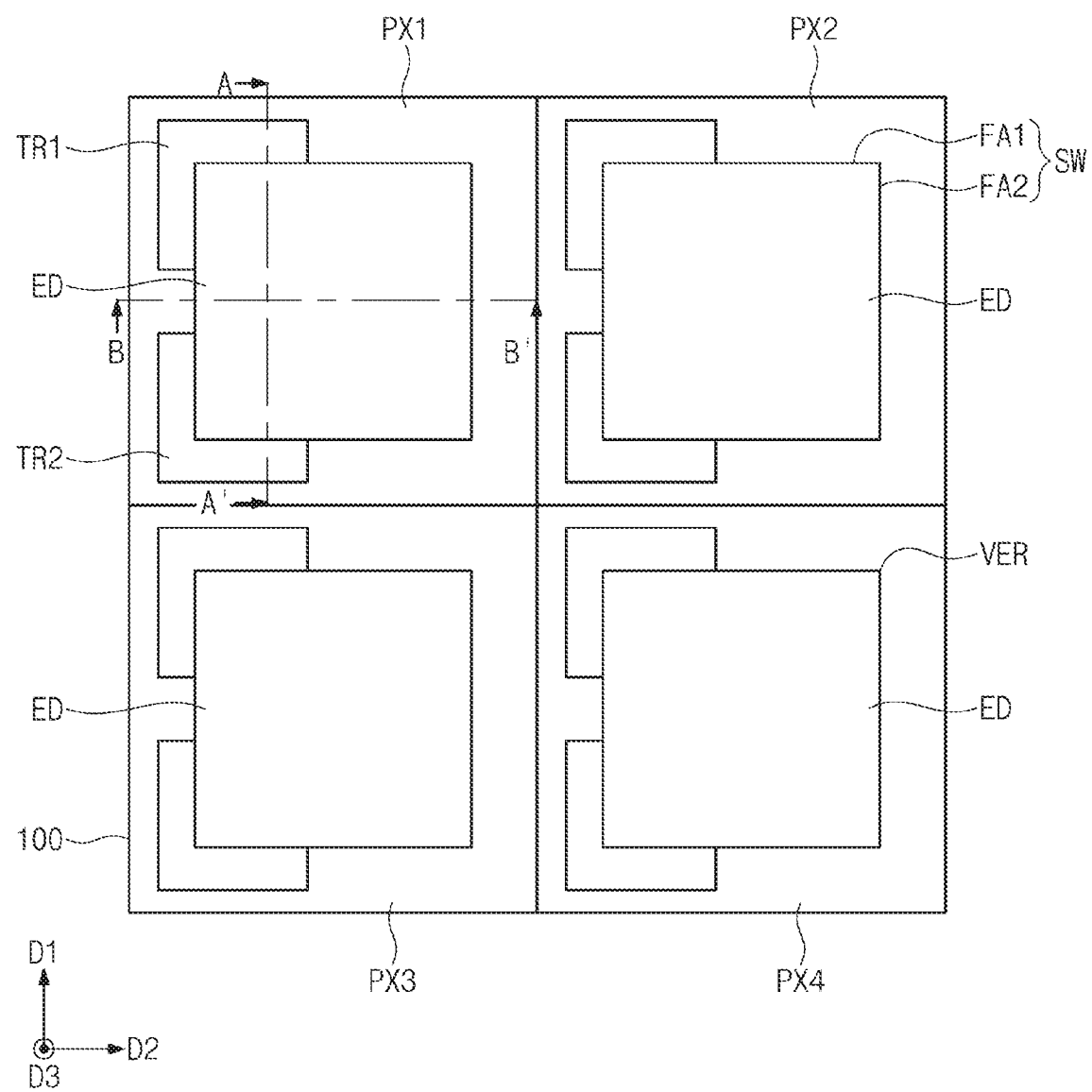
FIG. 3 illustrates a plan view showing a display panel of a display apparatus according to some example embodiments of the present inventive concepts.
Figure 4A:
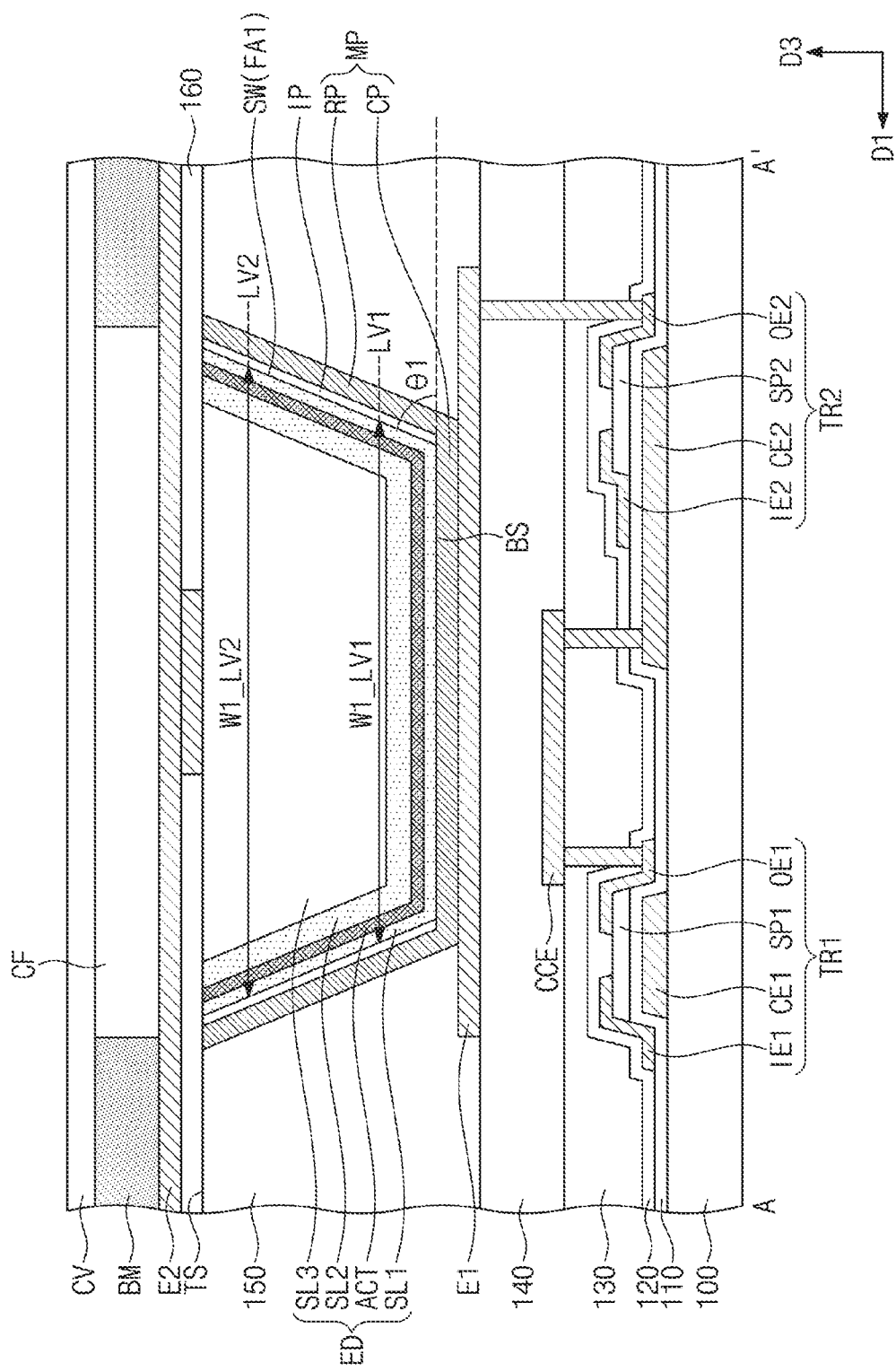
FIG. 4A illustrates a cross-sectional view taken along line A-A' of FIG. 3.
Figure 4B:
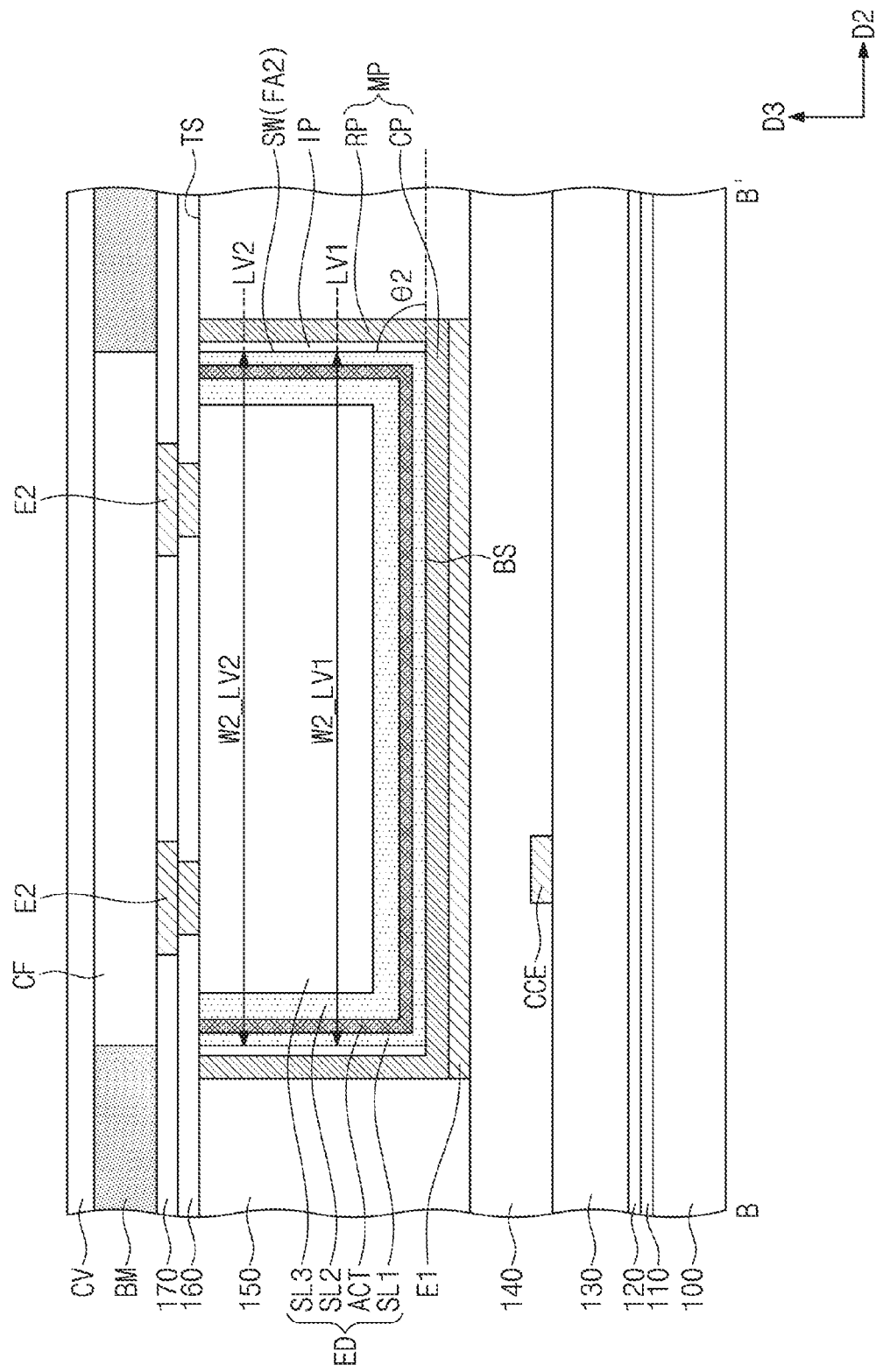
FIG. 4B illustrates a cross-sectional view taken along line B-B' of FIG. 3.
Figure 5:
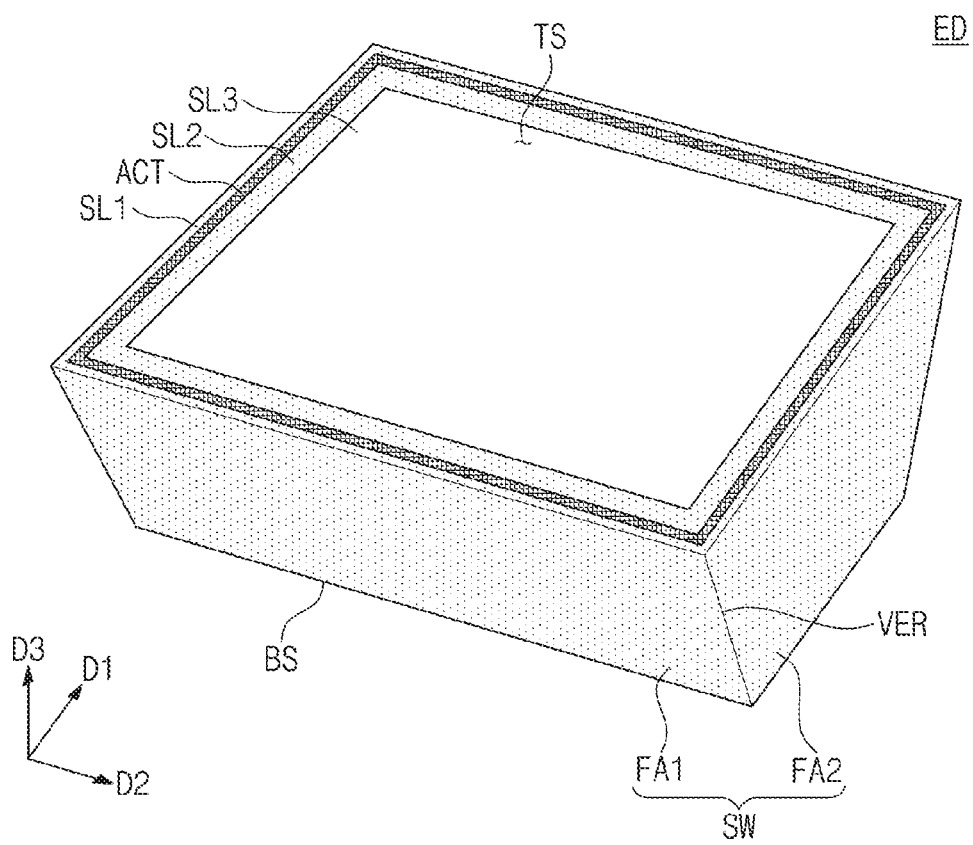
FIG. 5 illustrates a perspective view showing a light emitting device according to some example embodiments of the present inventive concepts.

FIG. 3 illustrates a plan view showing a display panel of a display apparatus according to some example embodiments of the present inventive concepts. FIG. 4A illustrates a cross-sectional view taken along line A-A' of FIG. 3. FIG. 4B illustrates a cross-sectional view taken along line B-B' of FIG. 3. FIG. 5 illustrates a perspective view showing a light emitting device according to some example embodiments of the present inventive concepts.

Referring to FIGS. 3, 4A, 4B, and 5, first to fourth pixels PX1 to PX4 may be provided on a base layer 100. The base layer 100 may include a silicon substrate, a plastic substrate, a glass substrate, a dielectric film, or a stack structure including a plurality of dielectric layers.

The first to fourth pixels PX1 to PX4 may be two-dimensionally arranged. The first and second pixels PX1 and PX2 may be adjacent to each other in a second direction D2, and the third and fourth pixels PX3 and PX4 may be adjacent to each other in the second direction D2. The first and third pixels PX1 and PX3 may be adjacent to each other in a first direction D1, and the second and fourth pixels PX2 and PX4 may be adjacent to each other in the first direction D1. Each of the first to fourth pixels PX1 to PX4 may include a first thin film transistor TR1, a second thin film transistor TR2, and a light emitting device ED. Among the first to fourth pixels PX1 to PX4, the first pixel PX1 will be discussed as a representative example.

The first thin film transistor TR1 and the second thin film transistor TR2 may be disposed on the base layer 100. The first thin film transistor TR1 may include a first control electrode CE1, a first input electrode IE1, a first output electrode OE1, and a first semiconductor pattern SP1. The second thin film transistor TR2 may include a second control electrode CE2, a second input electrode IE2, a second output electrode OE2, and a second semiconductor pattern SP2.

The first control electrode CE1 and the second control electrode CE2 may be provided on the base layer 100. The first control electrode CE1 and the second control electrode CE2 may include a conductive material. The base layer 100 may be provided thereon with a first dielectric layer 110 covering the first control electrode CE1 and the second control electrode CE2. For example, the first control electrode CE1 and the second control electrode CE2 may be interposed between the first dielectric layer 110 and the base layer 100.

The first semiconductor pattern SP1 and the second semiconductor pattern SP2 may be provided on the first dielectric layer 110. Each of the first and second semiconductor patterns SP1 and SP2 may include a semiconductor material. For example, the semiconductor material may include one or more of amorphous silicon, polycrystalline silicon, single crystalline silicon, semiconductor oxide, and compound semiconductor. Each of the first and second semiconductor patterns SP1 and SP2 may include a channel region through which electrons or holes migrate, a first impurity region, and a second impurity region spaced apart from the first impurity region across the channel region.

The first input electrode IE1 and the first output electrode OE1 may be provided on the first semiconductor pattern SP1. The first input electrode IE1 and the first output electrode OE1 may be respectively connected to the first impurity region and the second impurity region of the first semiconductor pattern SP1. The second input electrode IE2 and the second output electrode OE2 may be provided on the second semiconductor pattern SP2. The second input electrode IE2 and the second output electrode OE2 may be respectively connected to the first impurity region and the second impurity region of the second semiconductor pattern SP2.

The first dielectric layer 110 may be provided thereon with a second dielectric layer 120 covering the first and second semiconductor patterns SP1 and SP2, the first and second input electrodes IE1 and IE2, and the first and second output electrodes OE1 and OE2. For example, the first dielectric layer 110 and the second dielectric layer 120 may be provided therebetween with the first and second semiconductor patterns SP1 and SP2, the first and second input electrodes IE1 and IE2, and the first and second output electrodes OE1 and OE2.

A third dielectric layer 130 may be provided on the second dielectric layer 120. The third dielectric layer 130 may have a flat top surface. The third dielectric layer 130 may be provided thereon with a connection electrode CCE that electrically connects the first output electrode OE1 to the second control electrode CE2. The connection electrode CCE may include a first contact that penetrates the second and third dielectric layers 120 and 130 and is coupled to the first output electrode OE1. The connection electrode CCE may include a second contact that penetrates the first, second, and third dielectric layers 110, 120, and 130 and is coupled to the second control electrode CE2.

The third dielectric layer 130 may be provided thereon with a fourth dielectric layer 140 covering the connection electrode CCE. A first electrode E1 may be provided on the fourth dielectric layer 140. The first electrode E1 may include a third contact that penetrates the second, third, and fourth dielectric layers 120, 130, and 140 and is coupled to the second output electrode OE2.

The fourth dielectric layer 140 may be provided thereon with a fifth dielectric layer 150 covering the first electrode E1. A light emitting device ED may be provided on the first electrode E1. The light emitting device ED may be provided in the fifth dielectric layer 150. The light emitting device ED may include a first semiconductor layer SL1, an active layer ACT, a second semiconductor layer SL2, and a third semiconductor layer SL3 that are sequentially stacked.

The active layer ACT and the first, second, and third semiconductor layers SL1, SL2, and SL3 may include a III-V group compound semiconductor. The active layer ACT and the first, second, and third semiconductor layers SL1, SL2, and SL3 may include a GaN-based semiconductor. For example, the active layer ACT and the first, second, and third semiconductor layers SL1, SL2, and SL3 may include one or more of GaN, AN, AlGaN, InGaN, InN, InAlGaN, AlInN, and a combination thereof.

The first, second, and third semiconductor layers SL1, SL2, and SL3 may include the same GaN-based semiconductor. For example, the first, second, and third semiconductor layers SL1, SL2, and SL3 may include GaN. The first semiconductor layer SL1 may be a p-type semiconductor layer. The first semiconductor layer SL1 may include an impurity such as magnesium (Mg), zinc (Zn), potassium (Ca), strontium (Sr), or barium (Ba). The second semiconductor layer SL2 may be an n-type semiconductor layer. The second semiconductor layer SL2 may include an impurity such as silicon (Si), germanium (Ge), tin (Sn), selenium (Se), or tellurium (Te). The third semiconductor layer SL3 may be an undoped semiconductor layer. The active layer ACT may be interposed between the first semiconductor layer SL1 and the second semiconductor layer SL2.

The active layer ACT may be a region where holes injected through the first semiconductor layer SL1 recombine electrons injected through the second semiconductor layer SL2. Light may be produced due to the recombination of electrons and holes in the active layer ACT. The active layer ACT may have a single quantum well structure, a multiple quantum well structure, a quantum wire structure, or a quantum dot structure. For example, the active layer ACT may have a multiple quantum well structure including InGaN/GaN.

The first semiconductor layer SL1, the active layer ACT, the second semiconductor layer SL2, and the third semiconductor layer SL3 may be sequentially stacked on a bottom surface BS of the light emitting device ED. In addition, the first semiconductor layer SL1, the active layer ACT, the second semiconductor layer SL2, and the third semiconductor layer SL3 may be sequentially stacked on a sidewall SW of the light emitting device ED. For example, each of the first semiconductor layer SL1, the active layer ACT, and the second semiconductor layer SL2 may have a U-shaped cross section.

The active layer ACT adjacent to the sidewall SW of the light emitting device ED may be interposed between the first semiconductor layer SL1 and the second semiconductor layer SL2. For example, the active layer ACT adjacent to the sidewall SW of the light emitting device ED may be covered with the first semiconductor layer SL1 and thus may not be exposed. The first semiconductor layer SL1 adjacent to the sidewall SW of the light emitting device ED may passivate the active layer ACT. Because the active layer ACT is protected by the first semiconductor layer SL1, the active layer ACT may improve in electrical characteristics, and accordingly, the light emitting device ED may increase in luminance efficiency.

The sidewall SW of the light emitting device ED may include a first facet FA1 and a second facet FA2. The first facet FA1 may extend in the second direction D2. The second facet FA2 may extend in the first direction D1. The first facet FA1 and the second facet FA2 may be adjacent to each other. The first facet FA1 and the second facet FA2 may meet each other to define an edge VER on the sidewall SW of the light emitting device ED. The edge VER may extend from the bottom surface BS to a top surface TS of the light emitting device ED.

The light emitting device ED may have a wurtzite crystal structure. The top and bottom surfaces TS and BS of the light emitting device ED may be a polar plane or c-plane. The top surface TS and the bottom surface BS may each be a (0001) plane. The polar plane (or c-plane) may be a plane including one kind of atoms. For example, the polar plane (or c-plane) may be a plane including gallium (Ga) atoms or nitrogen (N) atoms.

The first facet FA1 of the light emitting device ED may be a semi-polar plane. The first facet FA1 may be inclined to the top surface TS and the bottom surface BS. The first facet FA1 may make an angle $\theta 1$ of 10° to 80° with the bottom surface BS. The first facet FA1 may be an (n–n0k) plane such as a (1-101) plane. The first facet FA1 may be an (n0-nk) plane such as a (10-11) plane. The first facet FA1 may be an (nn-2nk) plane such as a (11-22) or (11-21) plane. Herein, each of n and k is an integer equal to or greater than 1. For example, the first facet FA1 may be a (1-101) plane.

The inclined first facet FA1 may cause the light emitting device ED to have a cross section shaped like an inverted pyramid in the first direction D1. For example, the light emitting device ED may have a first width W1 in the first direction D1 that increases with increasing distance from the base layer 100.

The second facet FA2 of the light emitting device ED may be a non-polar plane or a-plane. The second facet FA2 may be substantially perpendicular to the top surface TS and the bottom surface BS. The second facet FA2 may make an angle $\theta 2$ of about 90° with the bottom surface BS. For example, the second facet FA2 may be a (11-20) plane.

The perpendicular second facet FA2 may cause the light emitting device ED to have a cross section shaped like a rectangle in the second direction D2. For example, the light emitting device ED may have a second width W2 in the second direction D2, and the second width W2 may be substantially constant even though departing from the base layer 100.

A first level LV1 and a second level LV2 may be defined based on the distance from a top surface of the base layer 100. The second level LV2 may be higher than the first level LV1. For example, a distance between the second level LV2 and the top surface of the base layer 100 may be greater than a distance between the first level LV1 and the top surface of the base layer 100.

The light emitting device ED may have a first width W1_LV1 at the first level LV1 less than a first width W1_LV2 at the second level LV2. A first difference may be provided between the first width W1_LV2 at the second level LV2 and the first width W1_LV1 at the first level LV1.

The light emitting device ED may have a second width W2_LV1 at the first level LV1 substantially the same as a second width W2_LV2 at the second level LV2. A second difference may be provided between the second width W2_LV2 at the second level LV2 and the second width W2_LV1 at the first level LV1. The first difference may be different from the second difference. For example, the first difference may be greater than the second difference. For another example, the first difference may be substantially the same as the second difference (see FIG. 34 which will be discussed below).

The sidewall SW of the light emitting device ED according to some example embodiments of the present inventive concepts may include the first facet FA1 and the second facet FA2 adjacent to each other. The first facet FA1 and the second facet FA2 may have different angles relative to the bottom surface BS or the top surface TS. The first facet FA1 may be a semi-polar plane, whereas the second facet FA2 may be a non-polar plane. In other embodiments, the first facet FA1 and the second facet FA2 may have substantially the same angle relative to the bottom surface BS or the top surface TS (see FIG. 34 which will be discussed below).

When the sidewall SW of the light emitting device ED includes only the second facet FA2, light produced from the active layer ACT may not be extracted, which may result in a reduction in light extraction efficiency. According to some example embodiments of the present inventive concepts, because the sidewall SW of the light emitting device ED includes not only the second facet FA2 but also the inclined first facet FA1, it may be possible to effectively extract light through the sidewall SW. In consequence, the light emitting device ED of the present inventive concepts may have excellent light extraction efficiency.

A conductive structure MP may be interposed between the light emitting device ED and the first electrode E1 and between the light emitting device ED and the fifth dielectric layer 150. The conductive structure MP may include a conductive material. For example, the conductive structure MP may include metal, such as nickel, copper, gold, or silver. The conductive structure MP may include a stacked layer of nickel/gold.

The conductive structure MP may include a connection pattern CP between the light emitting device ED and the first electrode E1 and also include a reflection pattern RP on the sidewall SW of the light emitting device ED. The connection pattern CP may directly cover the bottom surface BS of the light emitting device ED.

The reflection pattern RP may extend from the connection pattern CP toward the top surface TS of the light emitting device ED. An insulation pattern IP may be interposed between the reflection pattern RP and the sidewall SW of the light emitting device ED. The insulation pattern IP may insulate the reflection pattern RP from the light emitting device ED. The reflection pattern RP may prevent light produced from the active layer ACT from leaking through the sidewall SW of the light emitting device ED. For example, the reflection pattern RP may reflect light produced from the active layer ACT and guide emission of light through the top surface TS of the light emitting device ED.

An electrical signal may be selectively applied through the first electrode E1 and the connection pattern CP to the bottom surface BS of the light emitting device ED. Because the insulation pattern IP insulates the reflection pattern RP from the light emitting device ED, no electrical signal may be applied to the sidewall SW of the light emitting device ED. As a result, the electrical signal may be selectively applied to the c-plane, or the polar plane of the light emitting device ED. Because no electrical signal is applied to the sidewall SW including the semi-polar plane and the non-polar plane, the light emitting device ED may increase in luminance efficiency.

A sixth dielectric layer 160 may be provided on the fifth dielectric layer 150. A seventh dielectric layer 170 may be provided on the sixth dielectric layer 160. A second electrode E2 may be provided on the light emitting device ED. The second electrode E2 may be disposed in the seventh dielectric layer 170. The second electrode E2 may be electrically connected to the third semiconductor layer SL3 of the light emitting device ED through a fourth contact penetrating the sixth dielectric layer 160. For example, the second electrode E2 may extend in the first direction D1 on the sixth dielectric layer 160. The second electrode E2 may be electrically connected to the second power line PL2 discussed above with reference to FIG. 2. For example, the second electrode E2 may be supplied with the second power voltage ELVSS of FIG. 2.

Each of the connection electrode CCE, the first electrode E1, and the second electrode E2 may include a conductive material. For example, the conductive material may include one or more of indium zinc oxide (IZO), indium tin oxide (ITO), indium gallium oxide (IGO), indium zinc gallium oxide (IGZO), and a combination thereof. The present inventive concepts, however, are not limited thereto. For another example, the conductive material may include metal, such as molybdenum, silver, titanium, copper, aluminum, or an alloy thereof.

A light shield pattern BM and a color filter CF may be provided on the seventh dielectric layer 170. The light shield pattern BM may have an opening that vertically overlaps the light emitting device ED, and the color filter CF may be provided in the opening. The light shield pattern BM may be a black matrix.

The color filter CF may include one or more of a red color filter, a green color filter, and a blue color filter. The color filter CF may receive light emitted from the light emitting device ED, and may be selectively transparent to light having a specific wavelength. For example, the color filter CF may include quantum dots. In other words, the color filter CF may be a quantum dot color filter.

The color filter CF may include a transparent material. When light emitted from the light emitting device ED is blue, the color filter CF in a blue color pixel may include a transparent material without quantum dots.

A cover layer CV may be provided on the light shield pattern BM and the color filter CF. The cover layer CV may include a transparent glass or a transparent plastic. The cover layer CV may protect the color filter CF and the light emitting device ED.

FIGS. 6A and 6B illustrate cross-sectional views respectively taken along lines A-A' and B-B' of FIG. 3, showing a display apparatus according to some example embodiments of the present inventive concepts. In the embodiment that follows, a detailed description of technical features repetitive to those of the display apparatus discussed above with reference to FIGS. 3, 4A, 4B, and 5 will be omitted, and a difference thereof will be discussed in detail.

Referring to FIGS. 3, 6A, and 6B, the light emitting device ED may be provided on its portion with a contact hole CNH that partially penetrates inside the light emitting device ED. The contact hole CNH may extend from the bottom surface BS toward the top surface TS of the light emitting device ED. The contact hole CNH may not completely penetrate the light emitting device ED. For example, the contact hole CNH may expose the third semiconductor layer SL3 of the light emitting device ED.

A first contact plug CNT1 may be provided in the contact hole CNH. The first contact plug CNT1 may contact the third semiconductor layer SL3 exposed through the contact hole CNH. A dielectric material IM may fill a space between the first contact plug CNT1 and the contact hole CNH. The second electrode E2 may be provided below the first contact plug CNT1. The second electrode E2 may be electrically connected through the first contact plug CNT1 to the third semiconductor layer SL3.

A second contact plug CNT2 may be provided between the light emitting device ED and the first electrode E1. The second contact plug CNT2 may contact the connection pattern CP. The first electrode E1 may be electrically connected to the first semiconductor layer SL1 through the second contact plug CNT2 and the connection pattern CP.

FIGS. 7, 9, 11, and 13 illustrate plan views showing a method of fabricating a light emitting device according to some example embodiments of the present inventive concepts. FIGS. 8A, 10A, 12A, and 14A illustrate cross-sectional views taken along line A-A' of FIGS. 7, 9, 11, and 13, respectively. FIGS. 8B, 10B, 12B, and 14B illustrate cross-sectional views taken along line B-B' of FIGS. 7, 9, 11, and 13, respectively.

Figure 7:
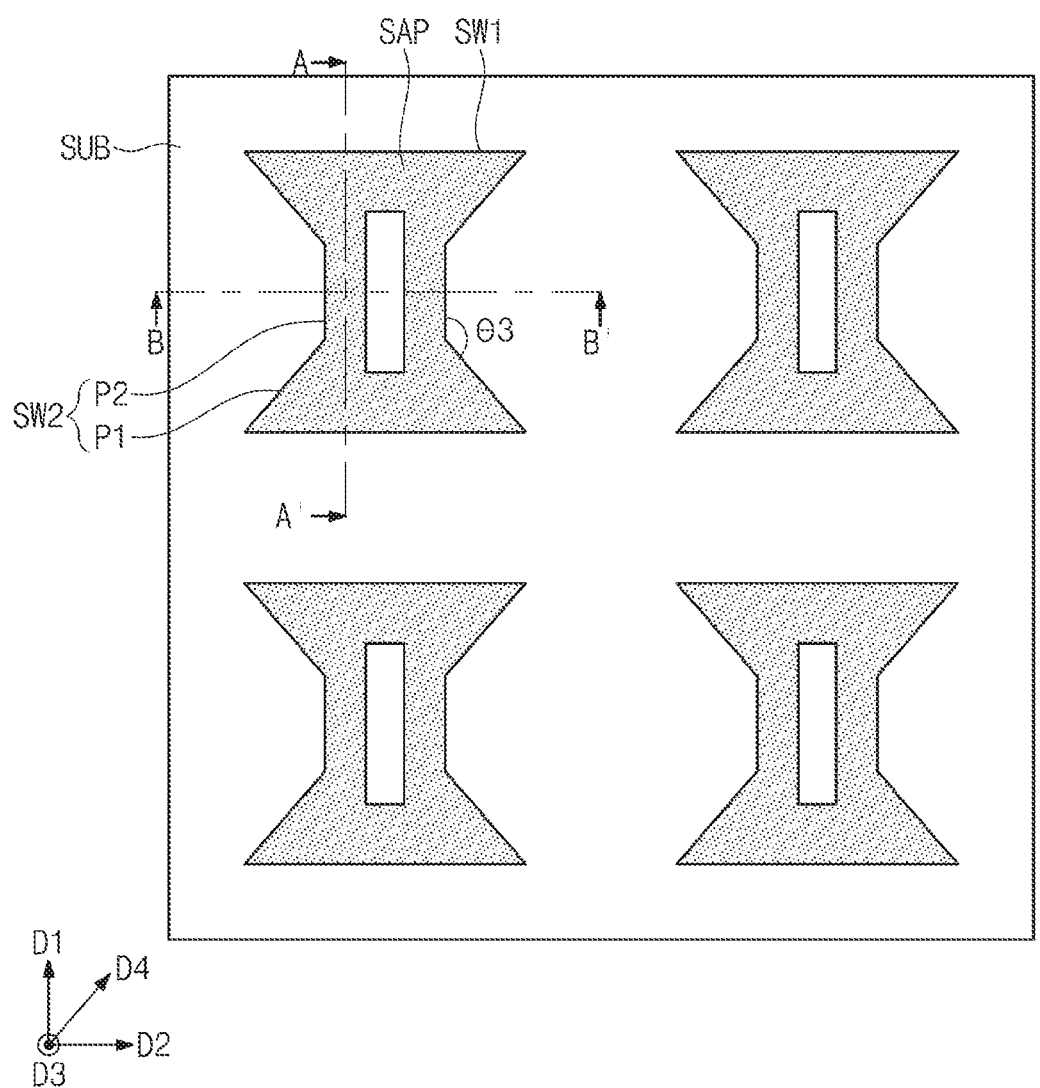
FIGS. 7, 9, 11, and 13 illustrate plan views showing a method of fabricating a light emitting device according to some example embodiments of the present inventive concepts.

Referring to FIGS. 7, 8A, and 8B, a plurality of sacrificial patterns SAP may be formed on a substrate SUB. The substrate SUB may be a sapphire substrate, a silicon substrate, a SiC substrate, or a GaAs substrate. For example, the substrate SUB may be a sapphire substrate. The formation of the sacrificial patterns SAP may include forming a photoresist layer on the substrate SUB and performing exposure and development processes on the photoresist layer. For example, the sacrificial patterns SAP may include a photoresist material. The sacrificial patterns SAP may be two-dimensionally arranged on the substrate SUB.

Each of the sacrificial patterns SAP may include a first sidewall SW1 and a second sidewall SW2. The first sidewall SW1 and the second sidewall SW2 may be adjacent to each other. The first sidewall SW1 may extend in a second direction D2. The second sidewall SW2 may extend in a first direction D1.

The first sidewall SW1 may have a linear shape. The second sidewall SW2 may have a concave shape that is recessed toward a central region of the sacrificial pattern SAP. For example, the second sidewall SW2 may include a first part P1 extending in a fourth direction D4 and a second part P2 extending in the first direction D1. The fourth direction D4 may be parallel to a top surface of the substrate SUB and may intersect the second direction D2. When viewed in plan, the first part P1 and the second part P2 may make an angle θ3 of greater than 90° with each other. For example, the angle θ3 made between the first part P1 and the second part P2 may be in a range from 100° to 170°.

Figure 9:
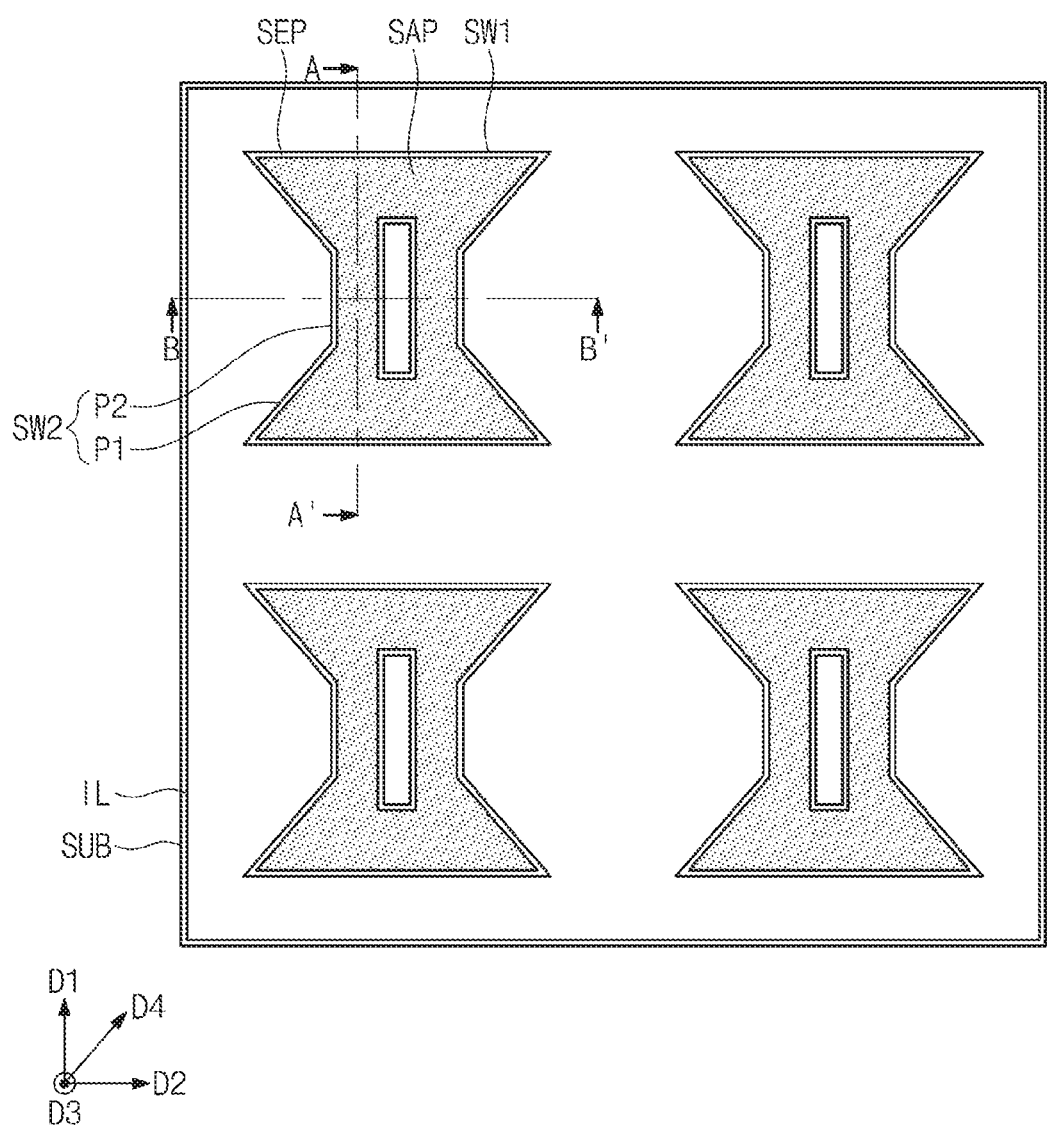

Referring to FIGS. 9, 10A, and 10B, an inorganic layer IL may be conformally formed on an entire surface of the substrate SUB. The formation of the inorganic layer IL may include performing an atomic layer deposition process or a chemical vapor deposition process. The inorganic layer IL may include one or more of silica ($SiO_2$), alumina ($Al_2O_3$), titania ($TiO_2$), zirconia ($ZrO_2$), yttria-zirconia ($Y_2O_3$—$ZrO_2$), copper oxide, tantalum oxide, aluminum nitride (AlN), and silicon nitride ($Si_3N_4$). For example, the inorganic layer IL may include alumina.

The inorganic layer IL may cover the top surface of the substrate SUB and a surface of each of the sacrificial patterns SAP. For example, a portion of the inorganic layer IL may cover the surface of the sacrificial pattern SAP. The portion of the inorganic layer IL covering the surface of the sacrificial pattern SAP may be a seed pattern SEP.

The seed pattern SEP may have a planar shape defined by the sacrificial pattern SAP. For example, the planar shape of the seed pattern SEP may be substantially the same as that of the sacrificial pattern SAP.

The seed pattern SEP may include a first sidewall SW1 and a second sidewall SW2. The first and second sidewalls SW1 and SW2 of the seed pattern SEP may be respectively defined by the first and second sidewalls SW1 and SW2 of the sacrificial pattern SAP. Thus, the first sidewall SW1 of the seed pattern SEP may have a linear shape, and the second sidewall SW2 of the seed pattern SEP may have a concave shape. The second sidewall SW2 of the seed pattern SEP may include a first part P1 extending in the fourth direction D4 and a second part P2 extending in the first direction D1.

Figure 11:
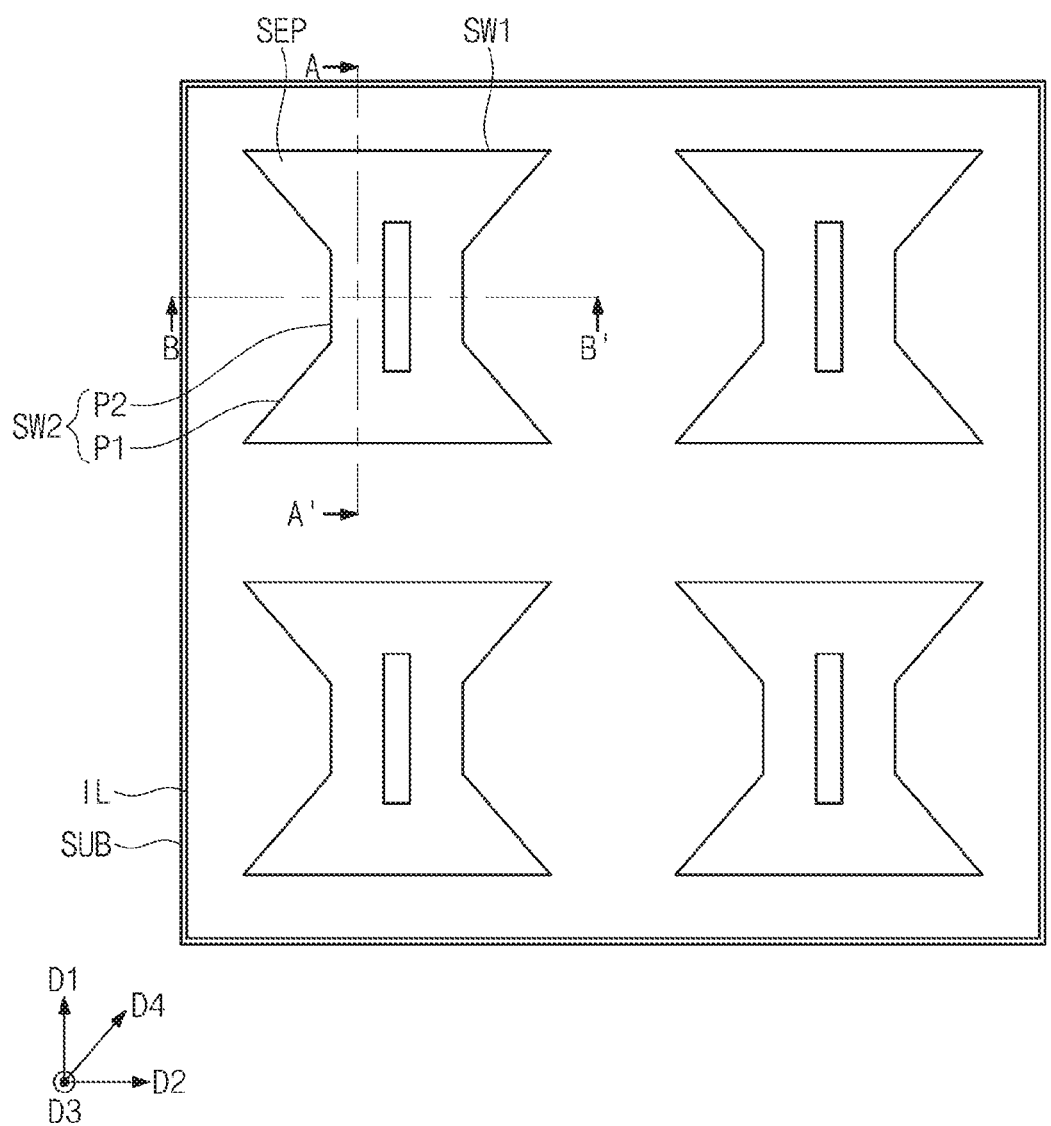
Figure 12A:
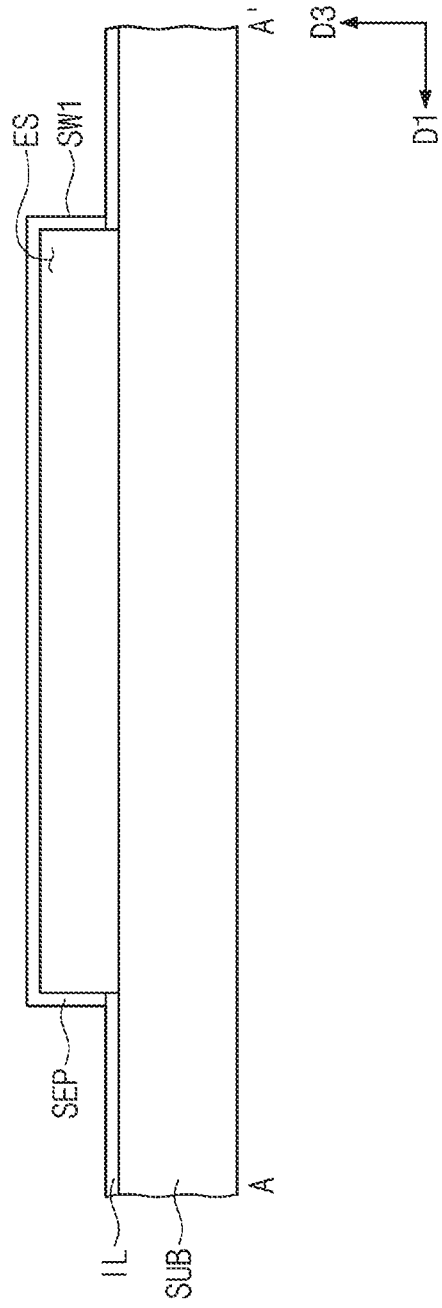
Figure 12B:
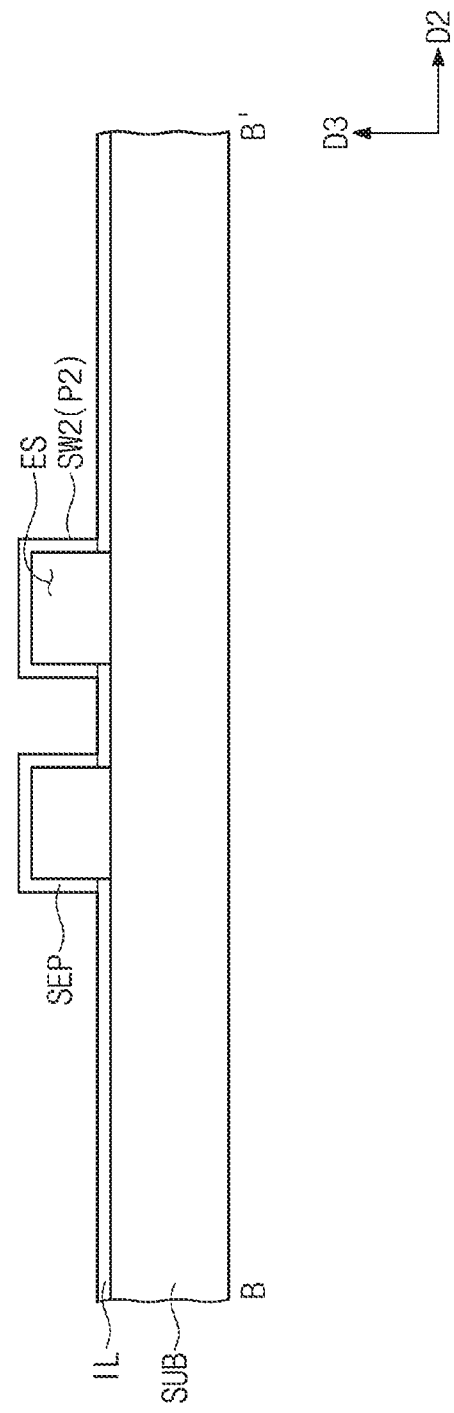

Referring to FIGS. 11, 12A, and 12B, the sacrificial patterns SAP may be selectively removed. For example, an annealing process may be performed such that the sacrificial patterns SAP may be pyrolyzed and removed. The removal of the sacrificial patterns SAP may form an empty space EP between the substrate SUB and the seed pattern SEP.

An annealing process may be additionally performed on the inorganic layer IL, and thus the seed pattern SEP may become dense and crystallized. For example, the inorganic layer IL may be annealed to crystallize the seed pattern SEP to have the same crystal structure as that of the substrate SUB.

Figure 13:
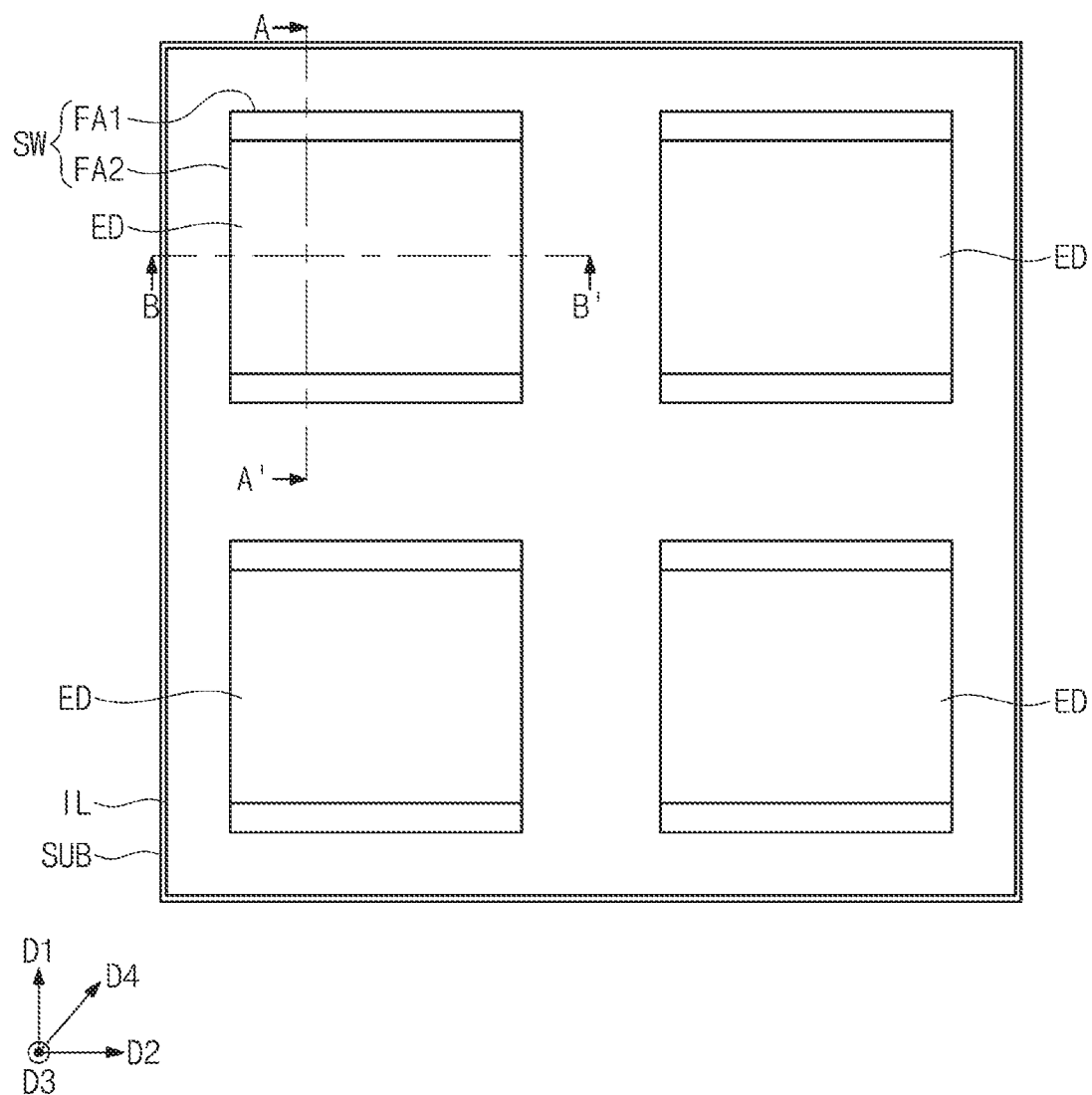
Figure 14A:
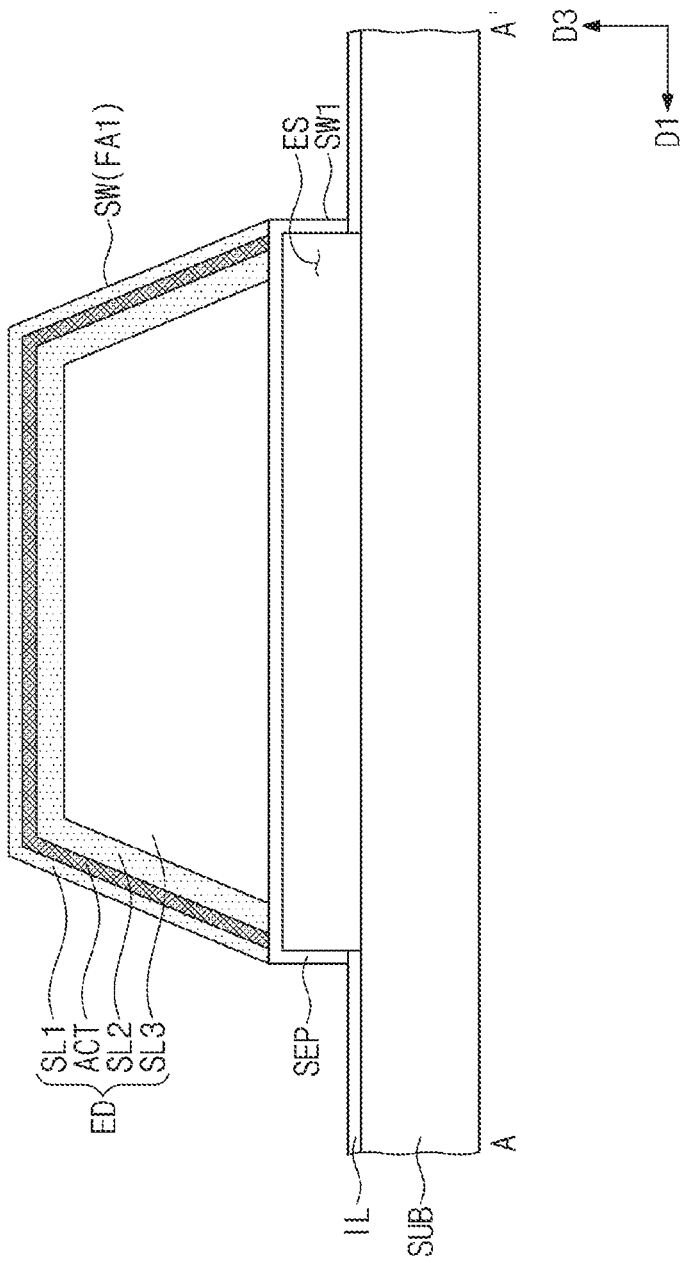
Figure 14B:
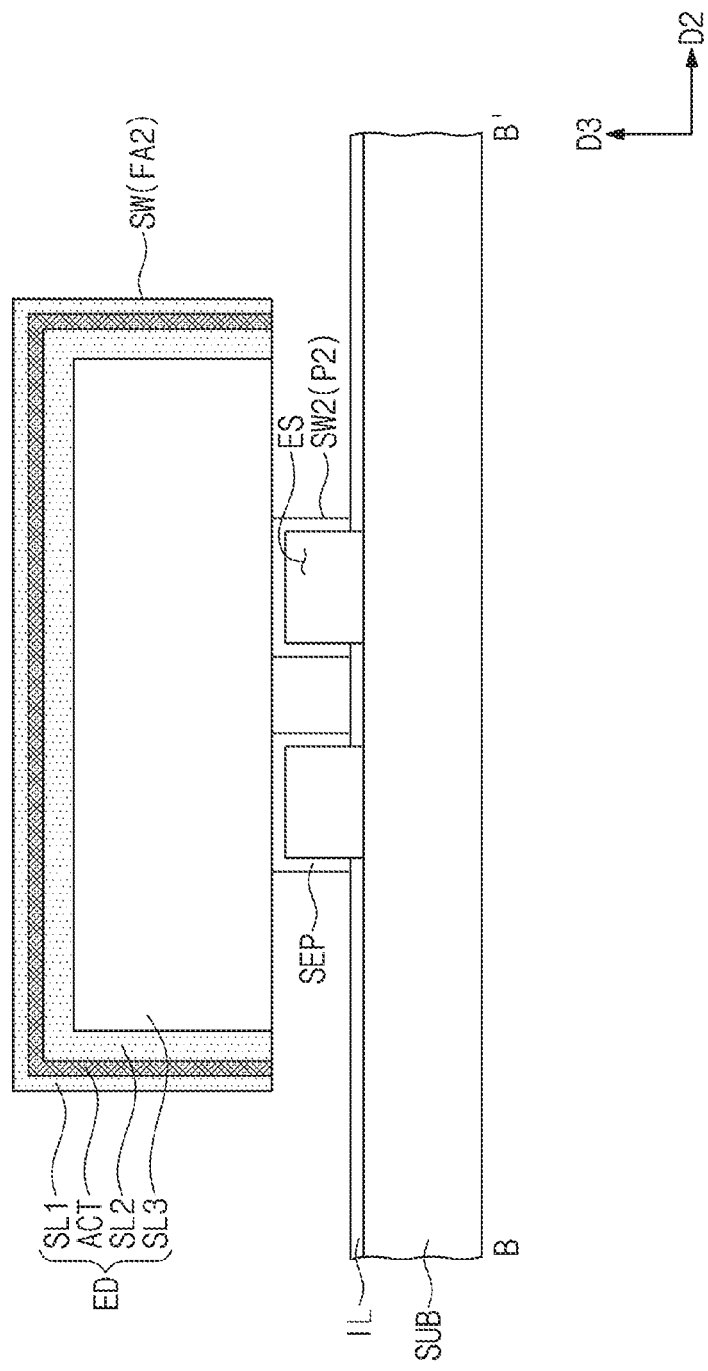
Figure 15A:
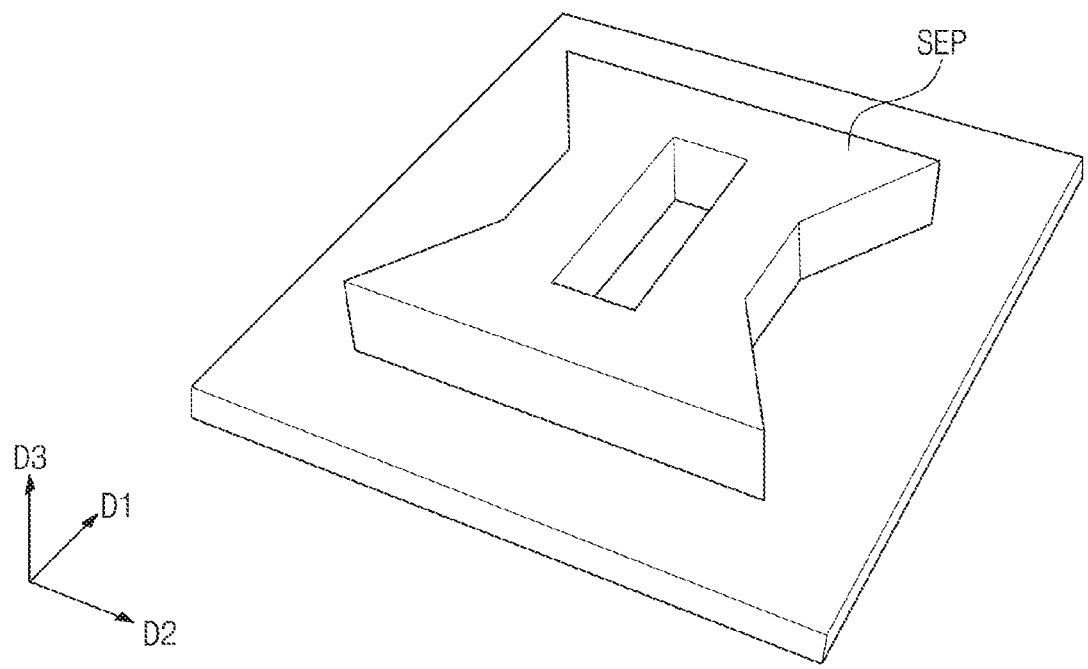
FIGS. 15A to 15D illustrate perspective views showing the time-series growth of a light emitting device on a sacrificial pattern in a selective epitaxial growth process according to some example embodiments of the present inventive concepts.
Figure 15B:
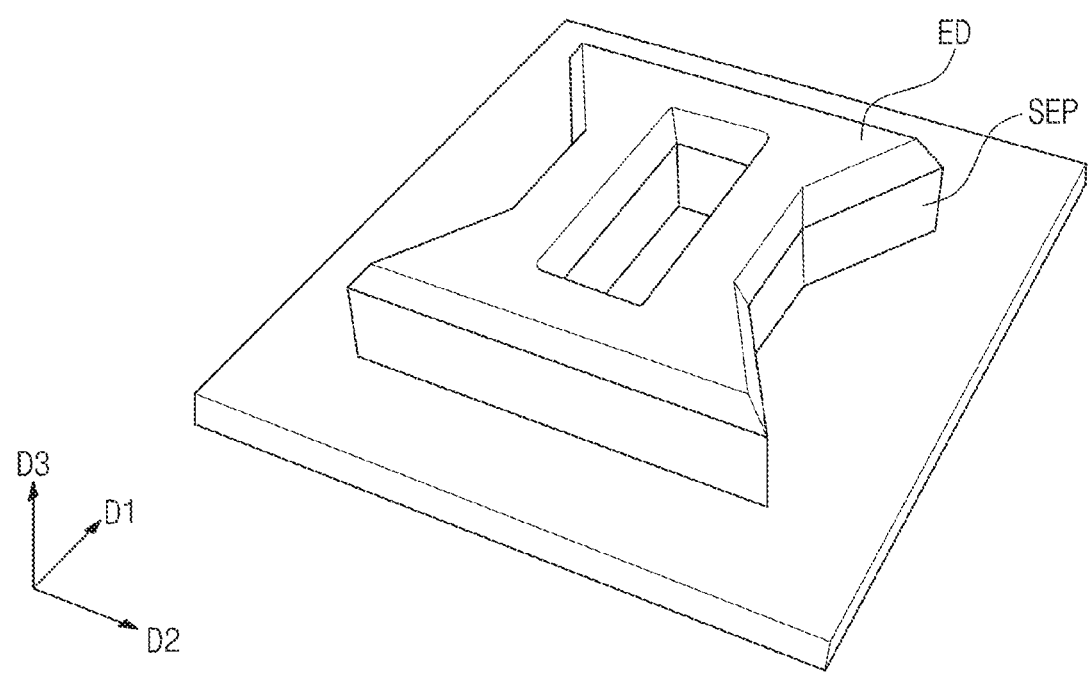
Figure 15C:
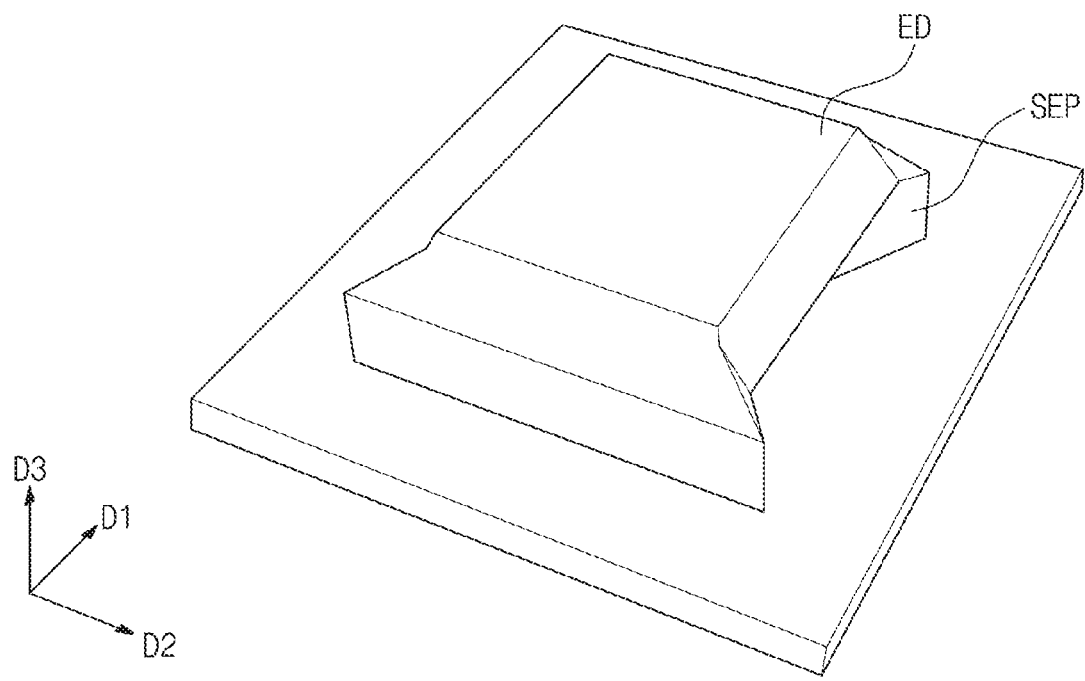
Figure 15D:
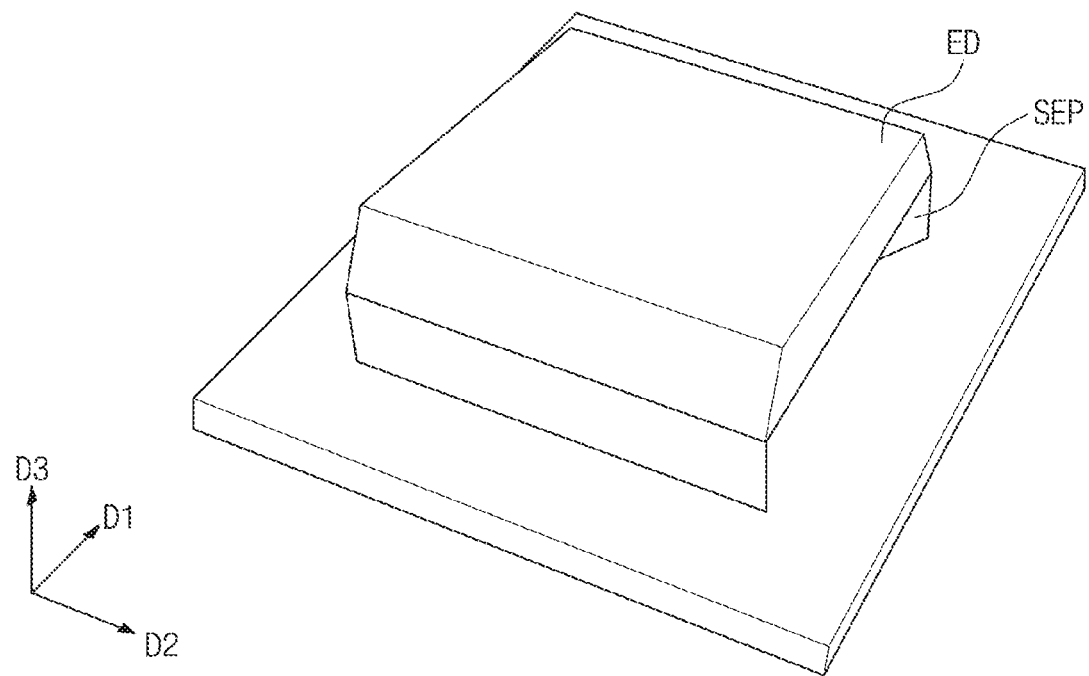

Referring to FIGS. 13, 14A, and 14B, a light emitting device ED may be formed on each of the seed patterns SEP. A plurality of light emitting devices ED may be formed in a two-dimensional arrangement corresponding to the two-dimensional arrangement of the seed patterns SEP. The formation of the light emitting device ED may include performing a selective epitaxial growth process in which a top surface of the seed pattern SEP is used a seed. The selective epitaxial growth process may include a chemical vapor deposition process or a molecular beam epitaxy process. The light emitting device ED may include at least one III-V compound semiconductor, such as GaN, AN, AlGaN, InGaN, InN, InAlGaN, AlInN, or a combination thereof.

During the selective epitaxial growth process, a source gas may be controlled to form the light emitting device ED having a multi-layered structure. For example, the formation of the light emitting device ED may include forming a third semiconductor layer SL3, forming a second semiconductor layer SL2 on the third semiconductor layer SL3, forming an active layer ACT on the second semiconductor layer SL2, and forming a first semiconductor layer SL1 on the active layer ACT.

The third semiconductor layer SL3 may be formed to include GaN. The second semiconductor layer SL2 may be formed to include GaN containing an impurity such as silicon (Si), germanium (Ge), tin (Sn), selenium (Se), or tellurium (Te). The active layer ACT may be formed to have a multiple quantum well structure including InGaN/GaN. The first semiconductor layer SL1 may be formed to include GaN containing an impurity such as magnesium (Mg), zinc (Zn), potassium (Ca), strontium (Sr), or barium (Ba). The active layer ACT and the first, second, and third semiconductor layers SL1, SL2, and SL3 may be successively formed in a single process chamber.

During the selective epitaxial growth process, the III-V group compound semiconductor may grow at different growth rates depending on crystal planes thereof. For example, a sidewall SW of the light emitting device ED may include a first facet FA1 and a second facet FA2. The first facet FA1 may be a semi-polar plane. The first facet FA1 may be inclined to the top surface of the substrate SUB. The second facet FA2 may be a non-polar plane. The second facet FA2 may be perpendicular to the top surface of the substrate SUB.

FIGS. 15A to 15D illustrate perspective views showing time-series growth of the light emitting device ED on the sacrificial pattern SAP by using the selective epitaxial growth process according to some example embodiments of the present inventive concepts. Referring to FIGS. 13, 14A, 14B, and 15A to 15D, during the selective epitaxial growth process, the first facet FA1 of the III-V group compound semiconductor may grow at a first growth rate, and the second facet FA2 of the III-V group compound semiconductor may grow at a second growth rate. The first growth rate may be less than the second growth rate.

The first sidewall SW1 of the seed pattern SEP may have a linear shape. While the III-V group compound semiconductor, the first facet FA1 whose growth rate is low may remain on the first sidewall SW1. The second sidewall SW2 of the seed pattern SEP may have a concave shape. While the III-V group compound semiconductor grows, the second facet FA2 whose growth rate is high may remain on the second sidewall SW2. As a result, the first facet FA1 of the light emitting device ED may be formed on the first sidewall SW1 of the seed pattern SEP, and the second facet FA2 of the light emitting device ED may be formed on the second sidewall SW2 of the seed pattern SEP.

Because the second facet FA2 grows at relatively high rates, the light emitting device ED may be formed to have a width in the second direction D2 greater than a width in the second direction D2 of the seed pattern SEP.

Figure 16:
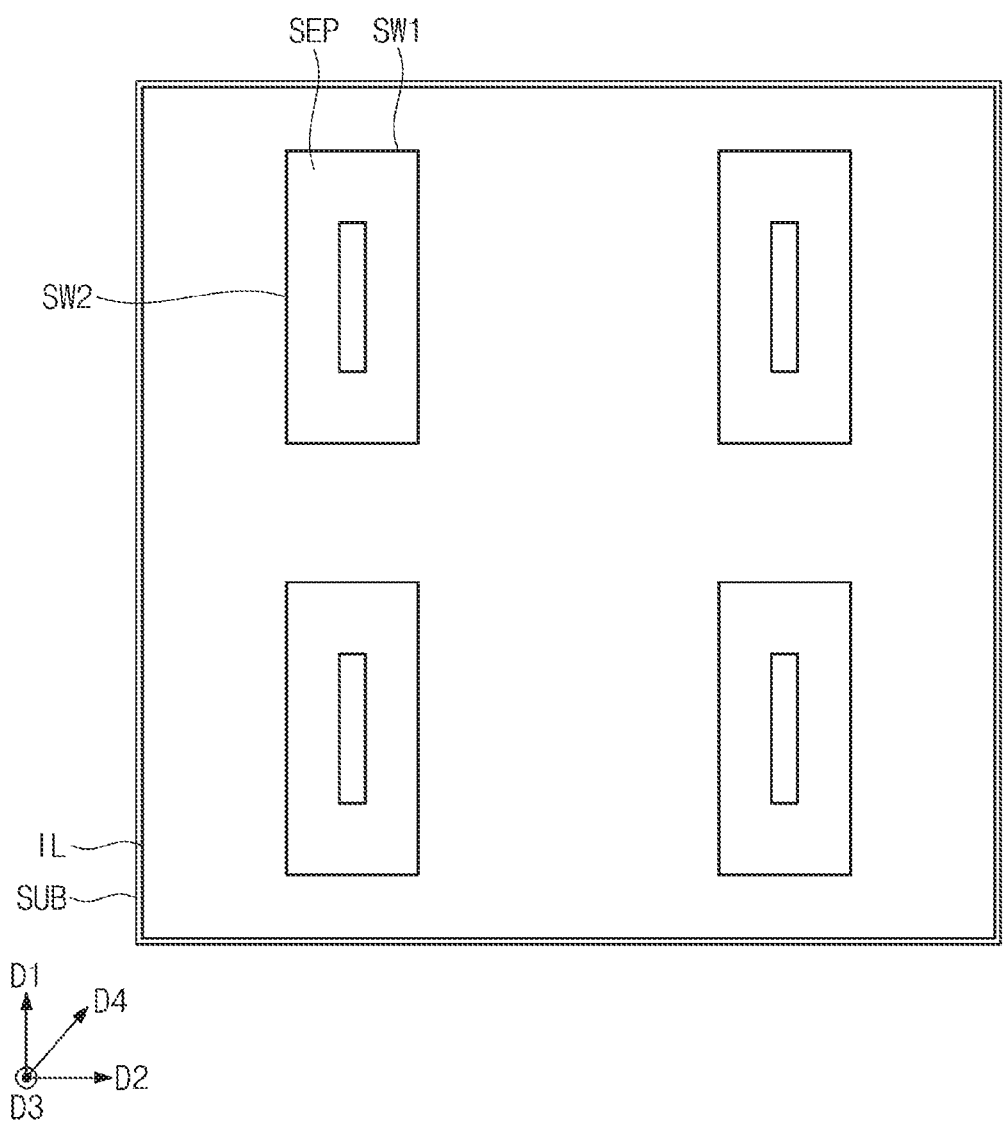
FIGS. 16 and 17 illustrate plan views showing a method of fabricating a light emitting device according to some example embodiments of the present inventive concepts.
Figure 17:
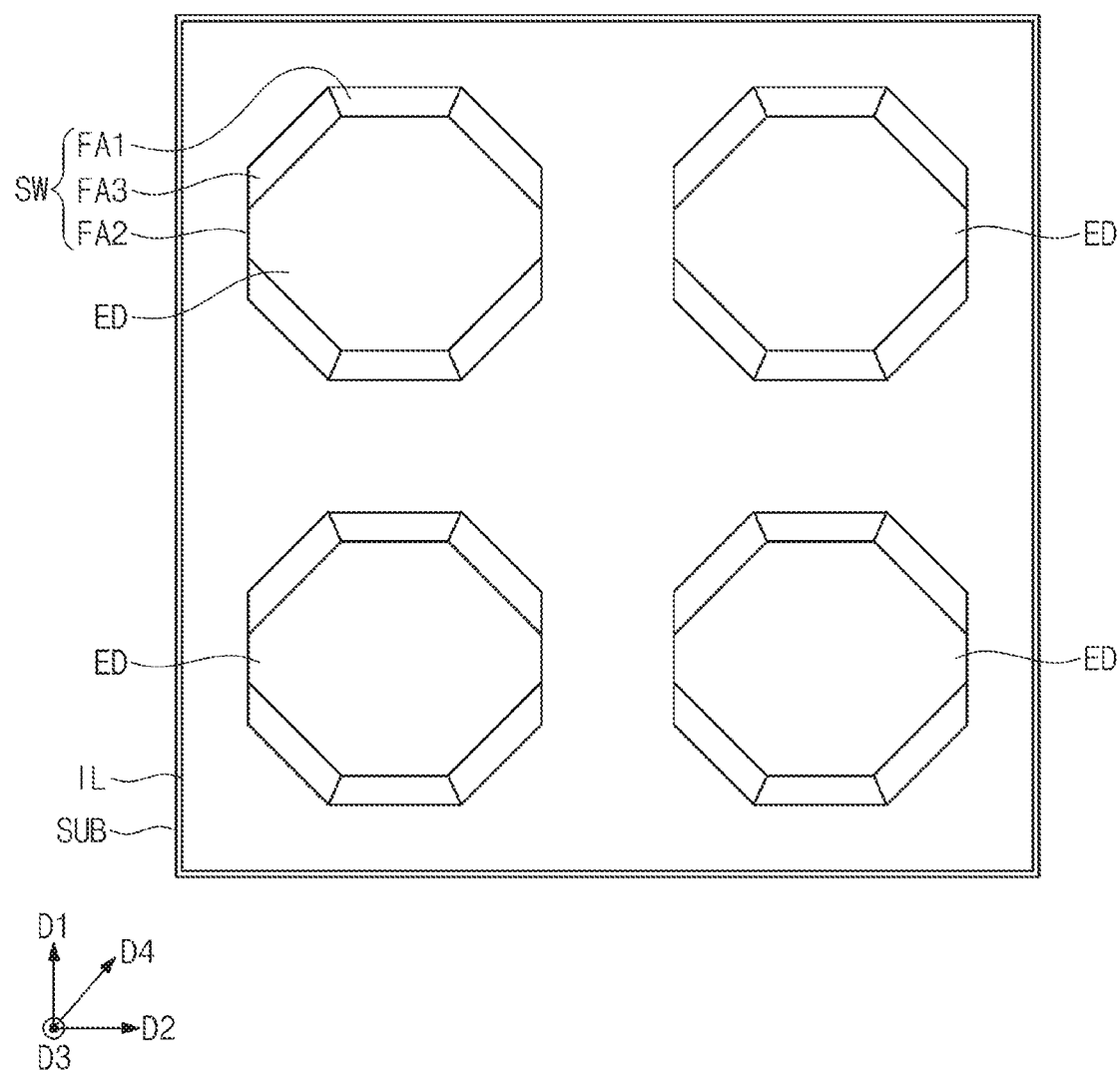

FIGS. 16 and 17 illustrate plan views showing a method of fabricating a light emitting device according to some example embodiments of the present inventive concepts. In the embodiment that follows, a detailed description of technical features repetitive to those of the fabrication method discussed above with reference to FIGS. 7 to 15D will be omitted, and a difference thereof will be discussed in detail.

Referring to FIG. 16, the seed pattern SEP may have a planar shape different from that of the seed pattern SEP shown above in FIG. 11. The seed pattern SEP may include the first sidewall SW1 and the second sidewall SW2. The second sidewall SW2 of the seed pattern SEP may extend in the first direction D1. The first sidewall SW1 of the seed pattern SEP may have a linear shape, and the second sidewall SW2 of the seed pattern SEP may also have a linear shape. For example, the seed pattern SEP may have a rectangular planar shape.

Referring to FIG. 17, the light emitting device ED may be formed on each of the seed patterns SEP. The light emitting device ED may have a polygonal planar shape (e.g., an octagonal shape). The sidewall SW of the light emitting device ED may include the first facet FA1 and the second facet FA2, and further include a third facet FA3. The third facet FA3 may be interposed between the first facet FA1 and the second facet FA2. The third facet FA3 may be a semi-polar plane that is inclined to the top surface of the substrate SUB.

Unlike the seed pattern SEP shown above in FIG. 11, the second sidewall SW2 of the seed pattern SEP may not have a concave shape, but have a linear shape. While the III-V group compound semiconductor grows, the second facet FA2 whose growth rate is high may be formed on the second sidewall SW2 of the seed pattern SEP, and the third facet FA3 whose growth rate is low may also be formed on the second sidewall SW2 of the seed pattern SEP. A competitive relationship may be provided between growth of the second facet FA2 and growth of the third facet FA3. When overgrowth is performed, the second sidewall SW2 of the seed pattern SEP may be provided thereon without the second facet FA2, but with the third facet FA3.

In a method of fabricating a light emitting device according to some example embodiments of the present inventive concepts, the seed pattern SEP may be designed to have a planar shape corresponding to a desired shape of the light emitting device ED. When the desired shape of the light emitting device ED is a rectangular shape shown in FIG. 13, the seed pattern SEP may be formed to have a shape shown in FIG. 11, and then a selective epitaxial growth process may be performed. When the desired shape of the light emitting device ED is a honeycomb shape shown in FIG. 17, the seed pattern SEP may be formed to have a shape shown in FIG. 16, and then a selective epitaxial growth process may be performed.

Figure 18:
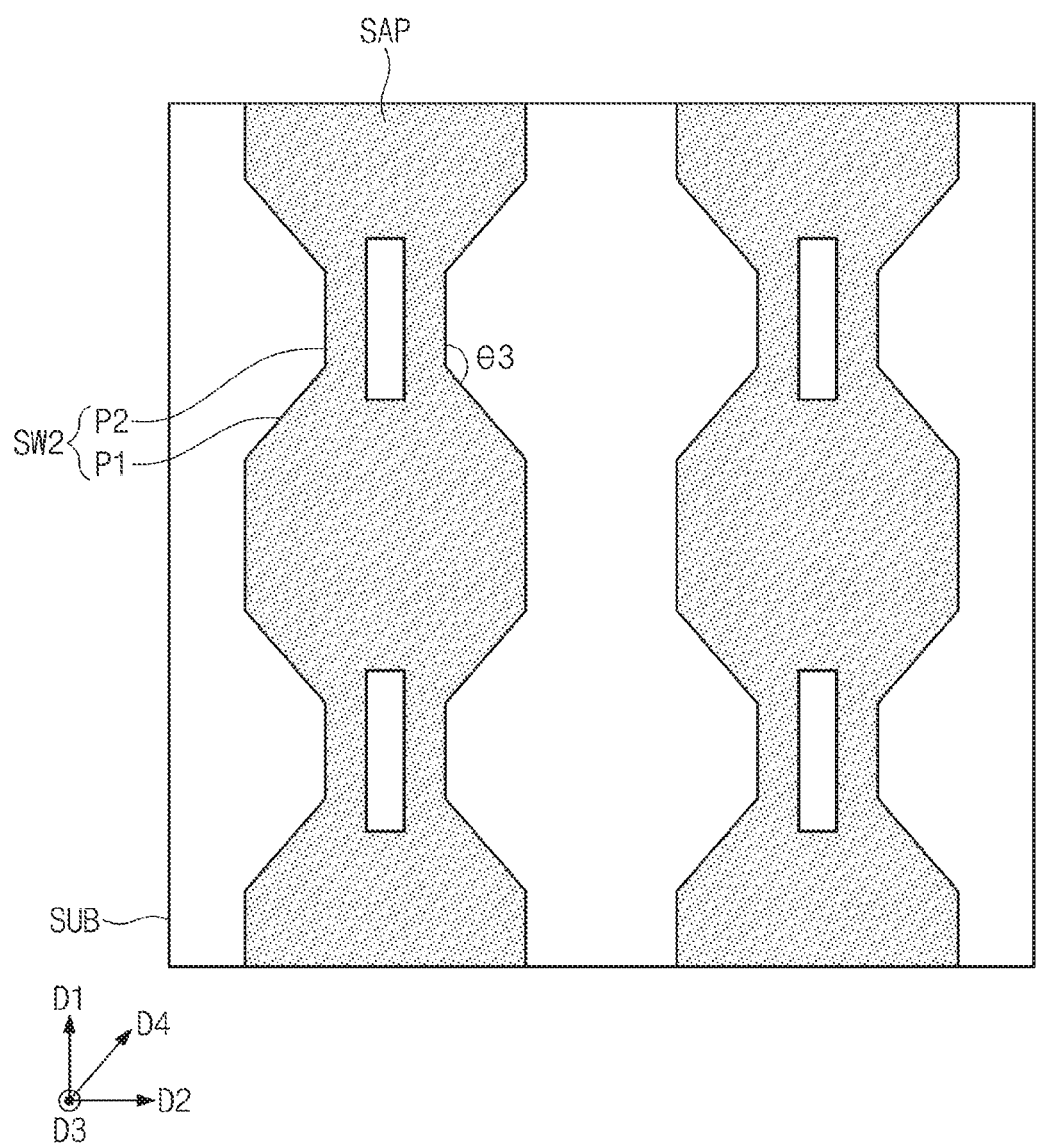
FIGS. 18, 19, and 20 illustrate plan views showing a method of fabricating a light emitting device according to some example embodiments of the present inventive concepts.
Figure 19:
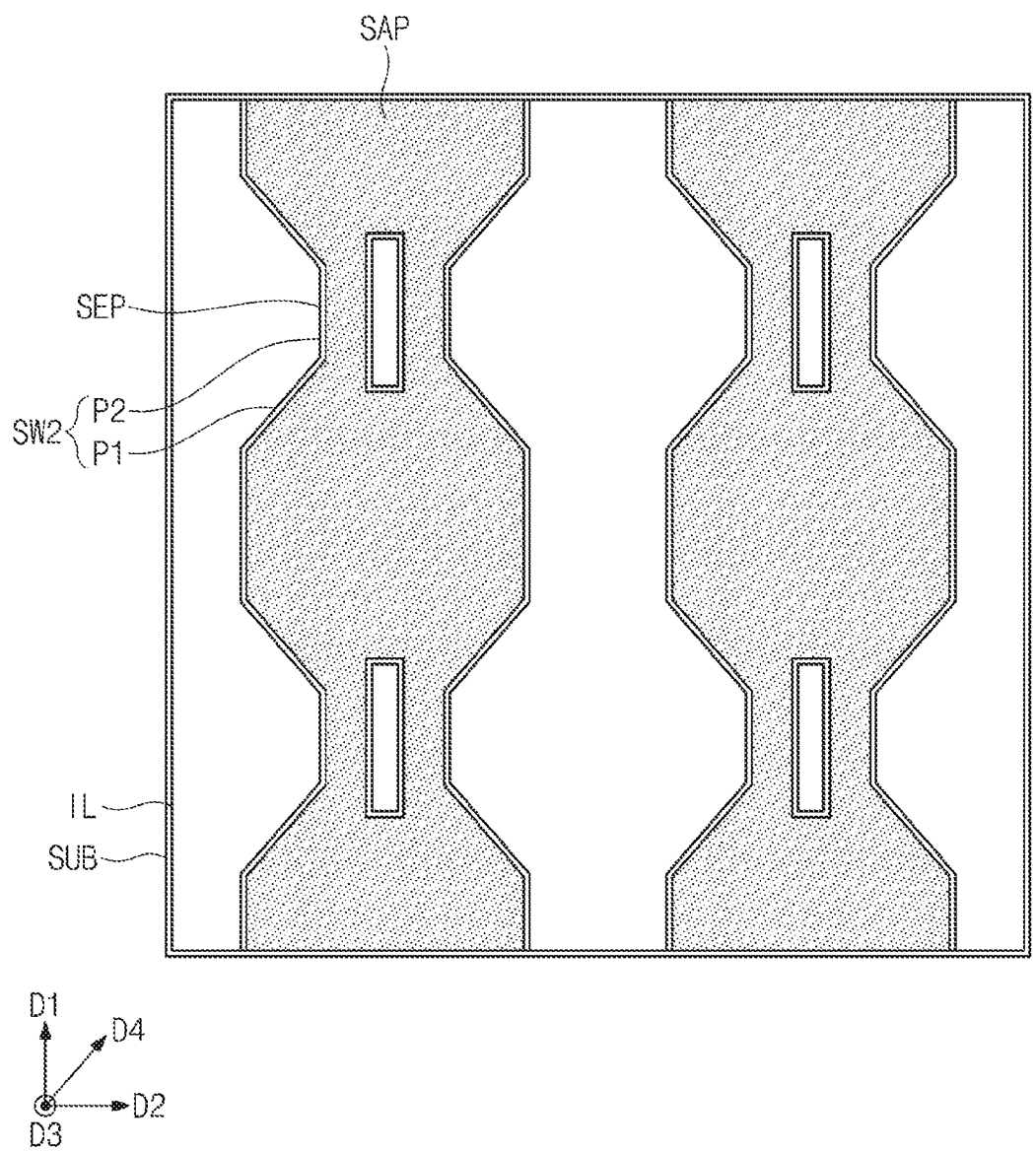
Figure 20:
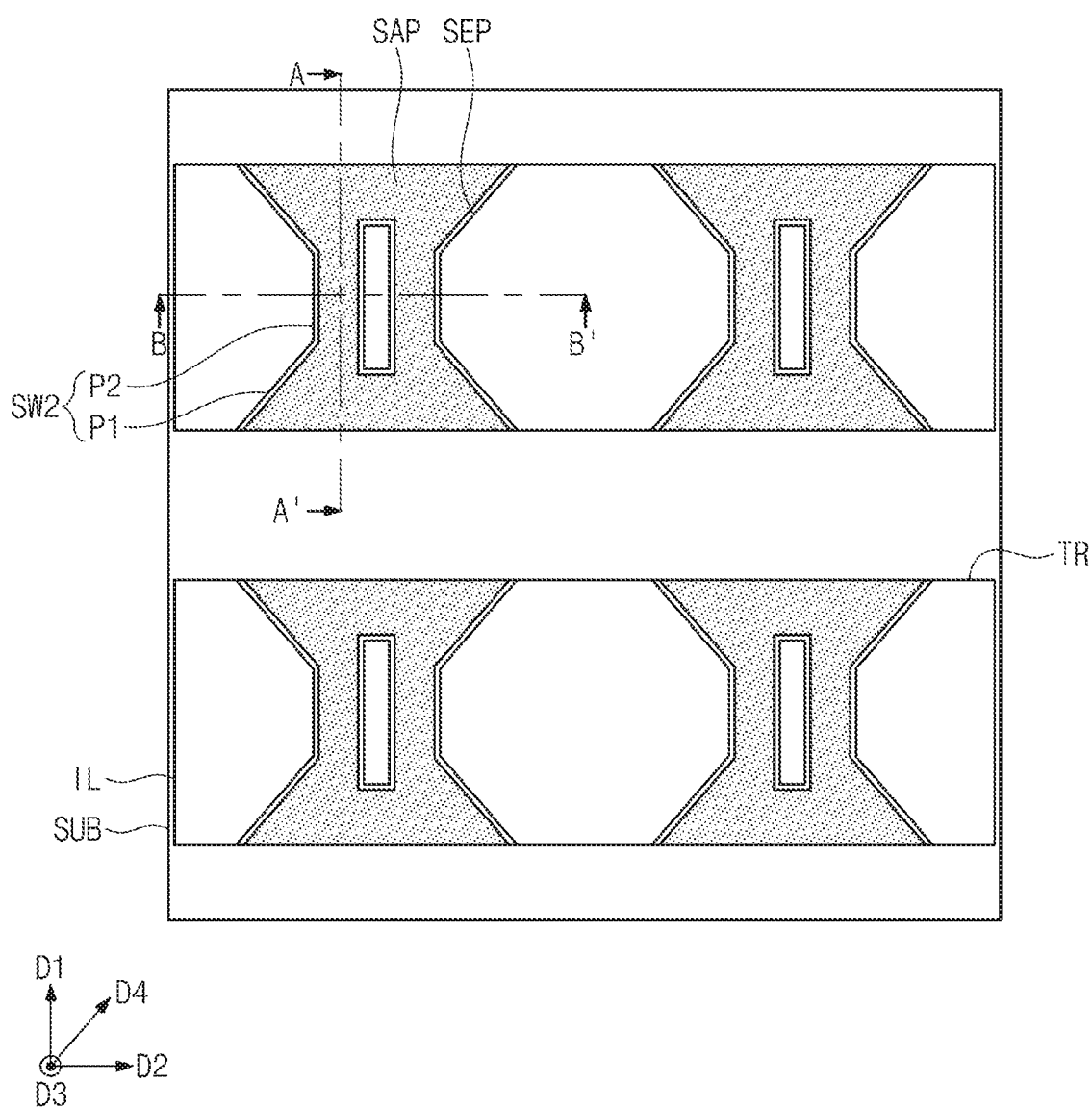
Figure 21A:
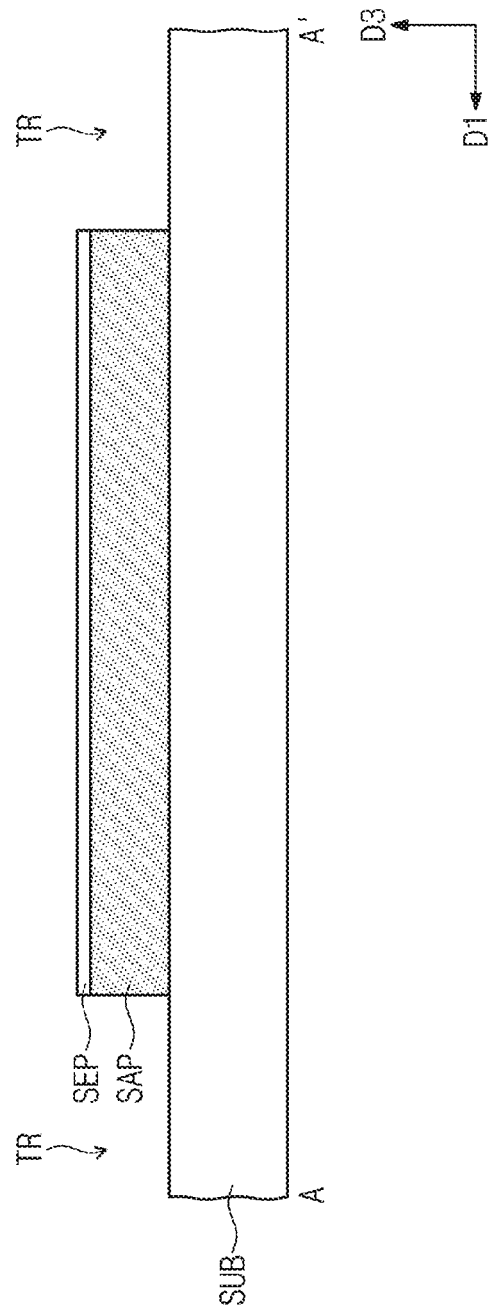

FIGS. 18, 19, and 20 illustrate plan views showing a method of fabricating a light emitting device according to some example embodiments of the present inventive concepts. FIGS. 21A and 21B illustrate cross-sectional views respectively taken along lines A-A' and B-B' of FIG. 20. In the embodiment that follows, a detailed description of technical features repetitive to those of the fabrication method discussed above with reference to FIGS. 7 to 15D will be omitted, and a difference thereof will be discussed in detail.

Referring to FIG. 18, a plurality of sacrificial patterns SAP may be formed on the substrate SUB. Each of the sacrificial patterns SAP may extend in the first direction D1.

Referring to FIG. 19, the inorganic layer IL may be conformally formed on the entire surface of the substrate SUB. The inorganic layer IL may include the seed pattern SEP covering each of the sacrificial patterns SAP.

Referring to FIGS. 20, 21A, and 21B, a patterning process may be performed on the seed patterns SEP and the sacrificial patterns SAP. The patterning process may form trenches TR extending in the second direction D2. The patterning process may separate a single seed pattern SEP extending in the first direction D1 into a plurality of seed patterns SEP. The trenches TR may separate a single seed pattern SEP extending in the first direction D1 into a plurality of seed patterns SEP. A sidewall of the sacrificial pattern SAP may be partially exposed to the trenches TR.

Subsequently, as discussed above with reference to FIGS. 11, 12A, and 12B, the sacrificial patterns SAP may be selectively removed. Because the sidewall of the sacrificial pattern SAP is partially exposed to the trenches TR, it may be possible to easily remove the sacrificial patterns SAP. The seed patterns SEP may undergo a selective epitaxial growth process to form the light emitting devices ED.

Figure 22:
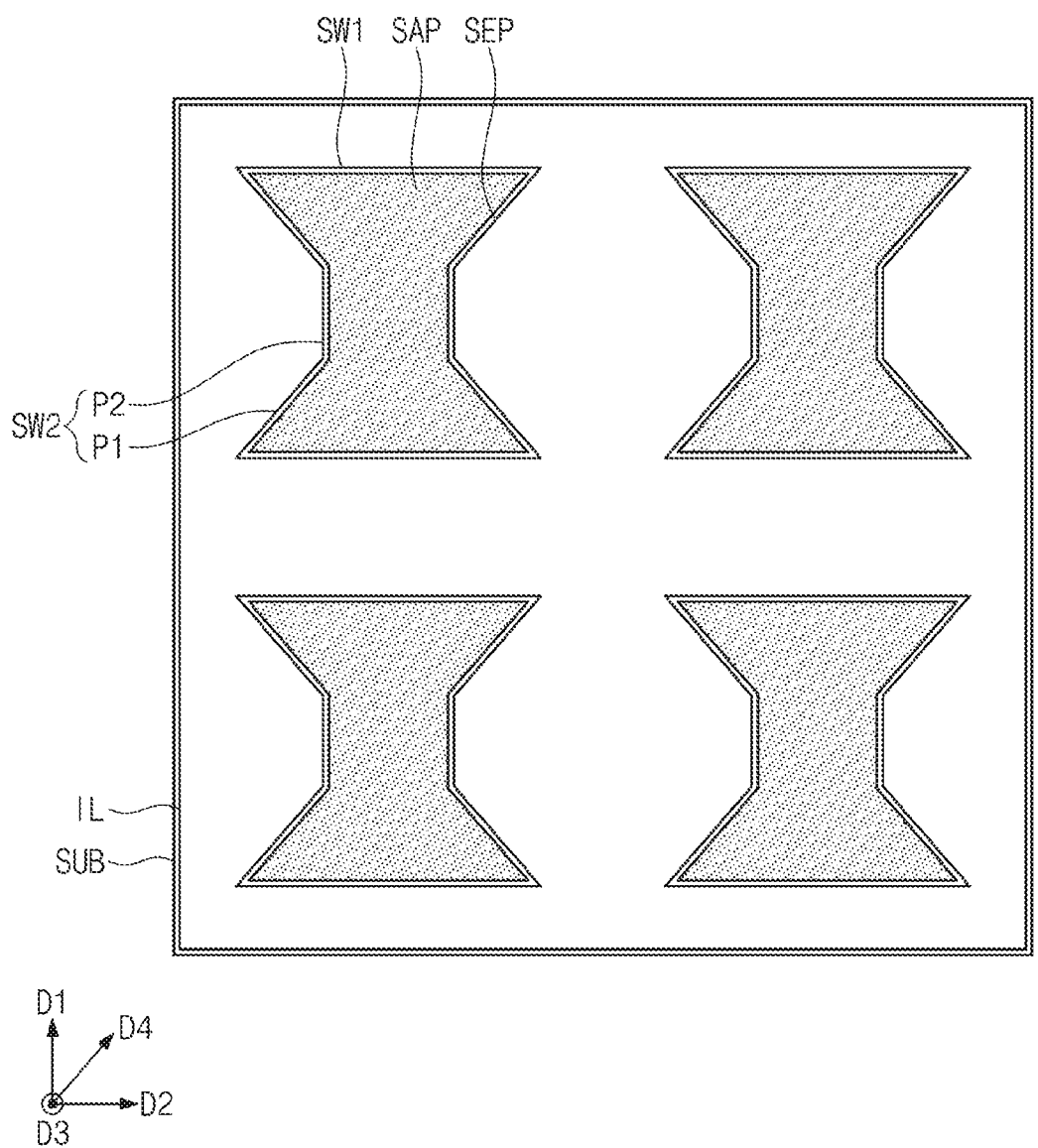
FIGS. 22 and 23 illustrate plan views showing a method of fabricating a light emitting device according to some example embodiments of the present inventive concepts.
Figure 23:
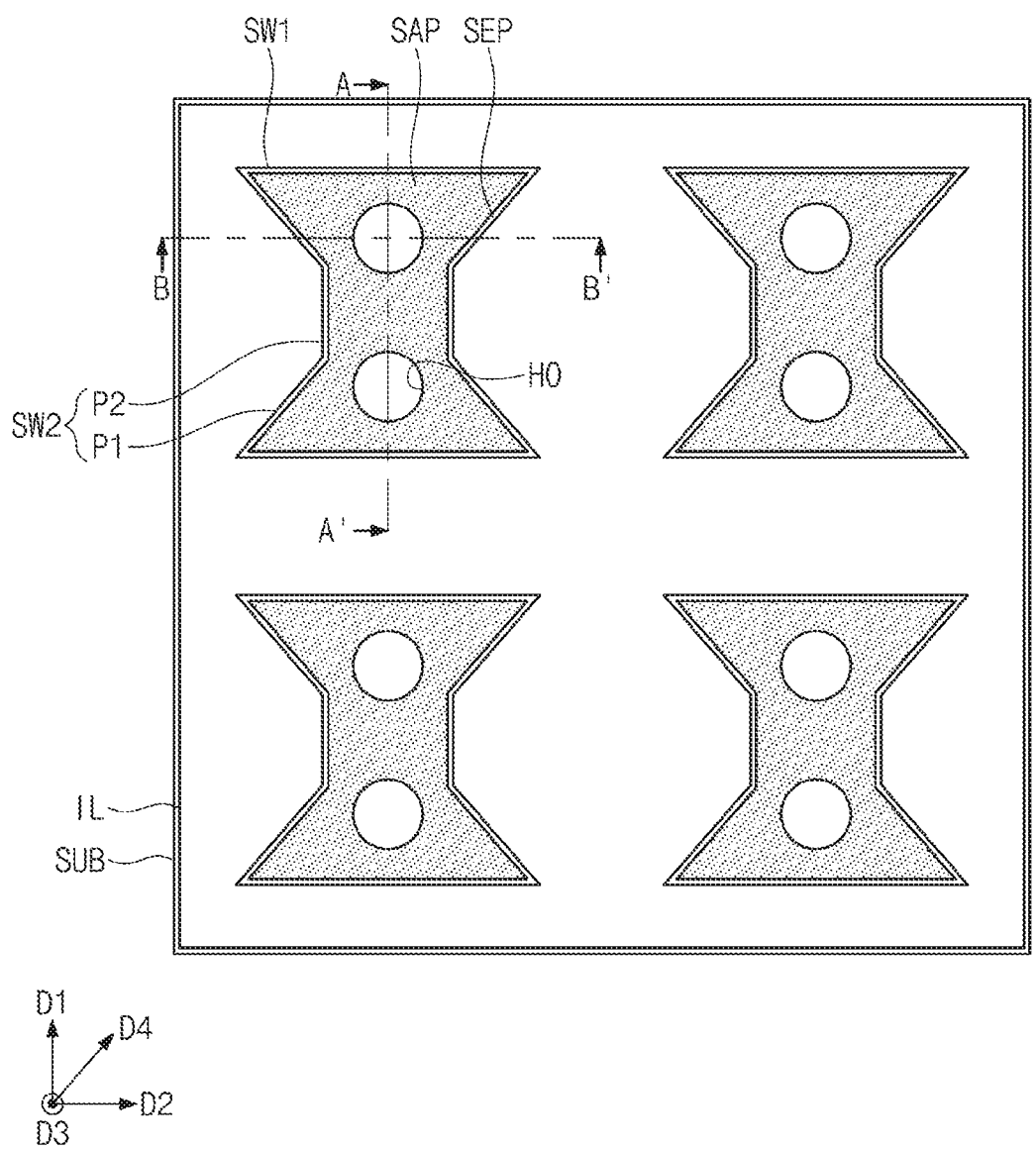
Figure 24A:
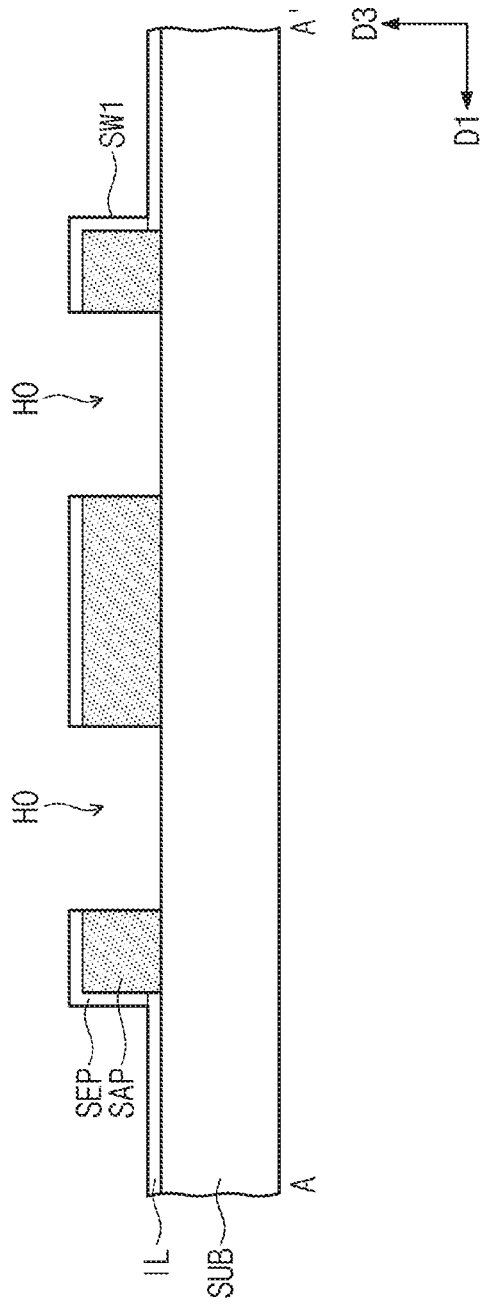
FIGS. 24A and 24B illustrate cross-sectional views respectively taken along lines A-A' and B-B' of FIG. 23.
Figure 24B:
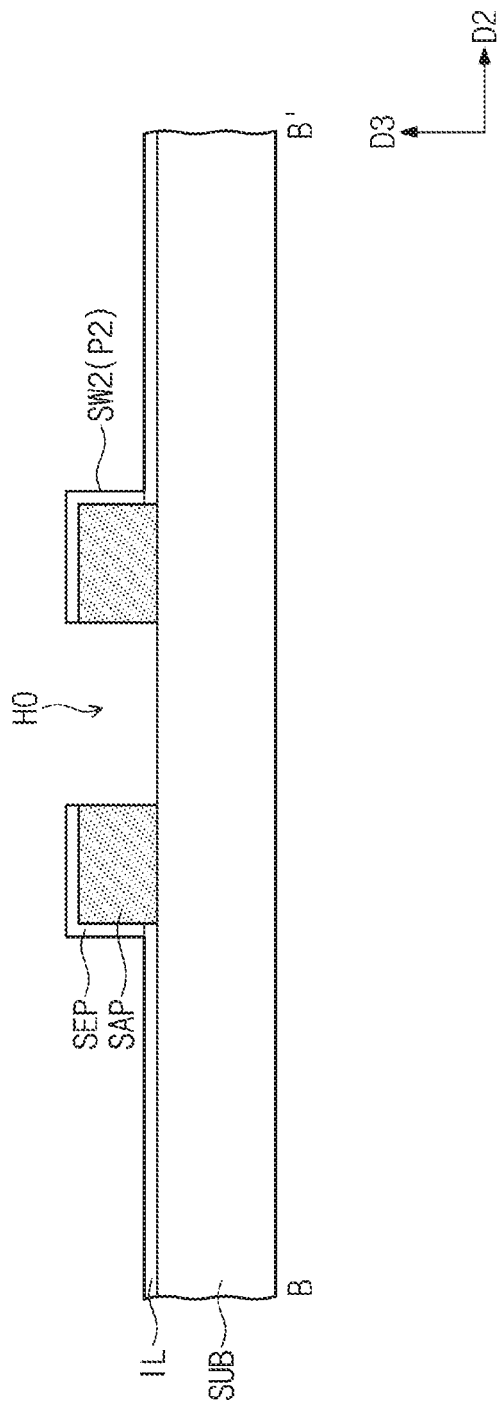

FIGS. 22 and 23 illustrate plan views showing a method of fabricating a light emitting device according to some example embodiments of the present inventive concepts. FIGS. 24A and 24B illustrate cross-sectional views respectively taken along lines A-A' and B-B' of FIG. 23. In the embodiment that follows, a detailed description of technical features repetitive to those of the fabrication method discussed above with reference to FIGS. 7 to 15D will be omitted, and a difference thereof will be discussed in detail.

Referring to FIG. 22, a plurality of sacrificial patterns SAP may be formed on the substrate SUB. Unlike the sacrificial pattern SAP discussed above with reference to FIG. 7, each of the sacrificial patterns SAP may be completely surrounded by the inorganic layer IL. The inorganic layer IL may be conformally formed on the entire surface of the substrate SUB. The inorganic layer IL may include the seed pattern SEP covering each of the sacrificial patterns SAP.

Referring to FIGS. 23, 24A, and 24B, the seed patterns SEP and the sacrificial patterns SAP may be patterned to form a plurality of holes HO. Each of the holes HO may penetrate the seed pattern SEP and the sacrificial pattern SAP, exposing the top surface of the substrate SUB. Each of the holes HO may expose an inner wall of the sacrificial pattern SAP.

Subsequently, as discussed above with reference to FIGS. 11, 12A, and 12B, the sacrificial patterns SAP may be selectively removed. Because the hole HO exposes the inner wall of the sacrificial pattern SAP, it may be possible to easily remove the sacrificial patterns SAP. The seed patterns SEP may undergo a selective epitaxial growth process to form the light emitting devices ED.

Figure 25:
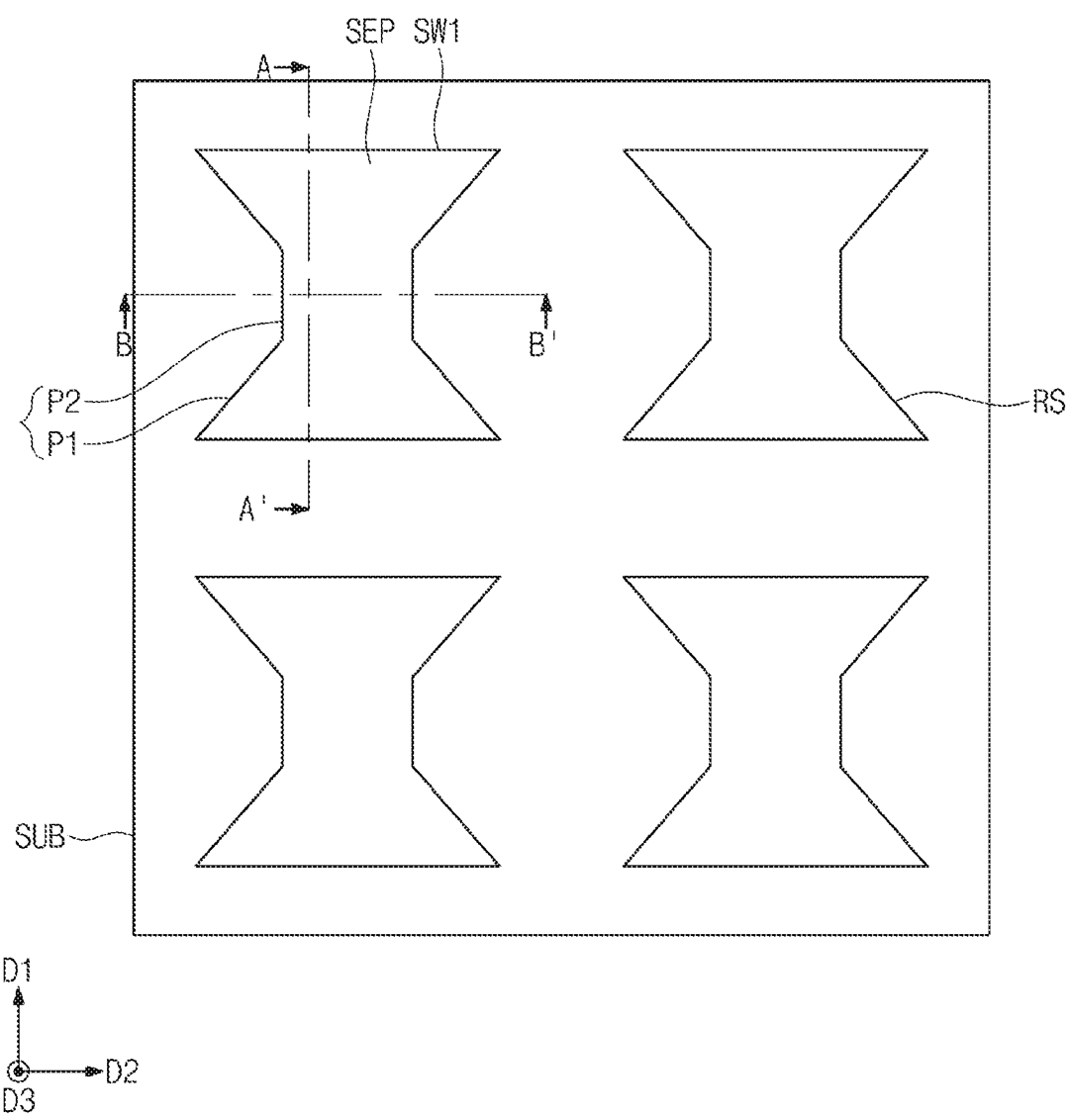
FIG. 25 illustrates a plan view showing a method of fabricating a light emitting device according to some example embodiments of the present inventive concepts.

FIG. 25 illustrates a plan view showing a method of fabricating a light emitting device according to some example embodiments of the present inventive concepts. FIGS. 26A and 26B illustrate cross-sectional views respectively taken along lines A-A' and B-B' of FIG. 25. In the embodiment that follows, a detailed description of technical features repetitive to those of the fabrication method discussed above with reference to FIGS. 7 to 15D will be omitted, and a difference thereof will be discussed in detail.

Referring to FIGS. 25, 26A, and 26B, the substrate SUB may be patterned to form a plurality of seed patterns SEP. For example, the substrate SUB may be patterned to form a recess RS, which recess RS may define an upper portion of the substrate SUB as the seed pattern SEP. The seed patterns SEP of the substrate SUB may undergo a selective epitaxial growth process to form the light emitting devices ED.

Figure 27:
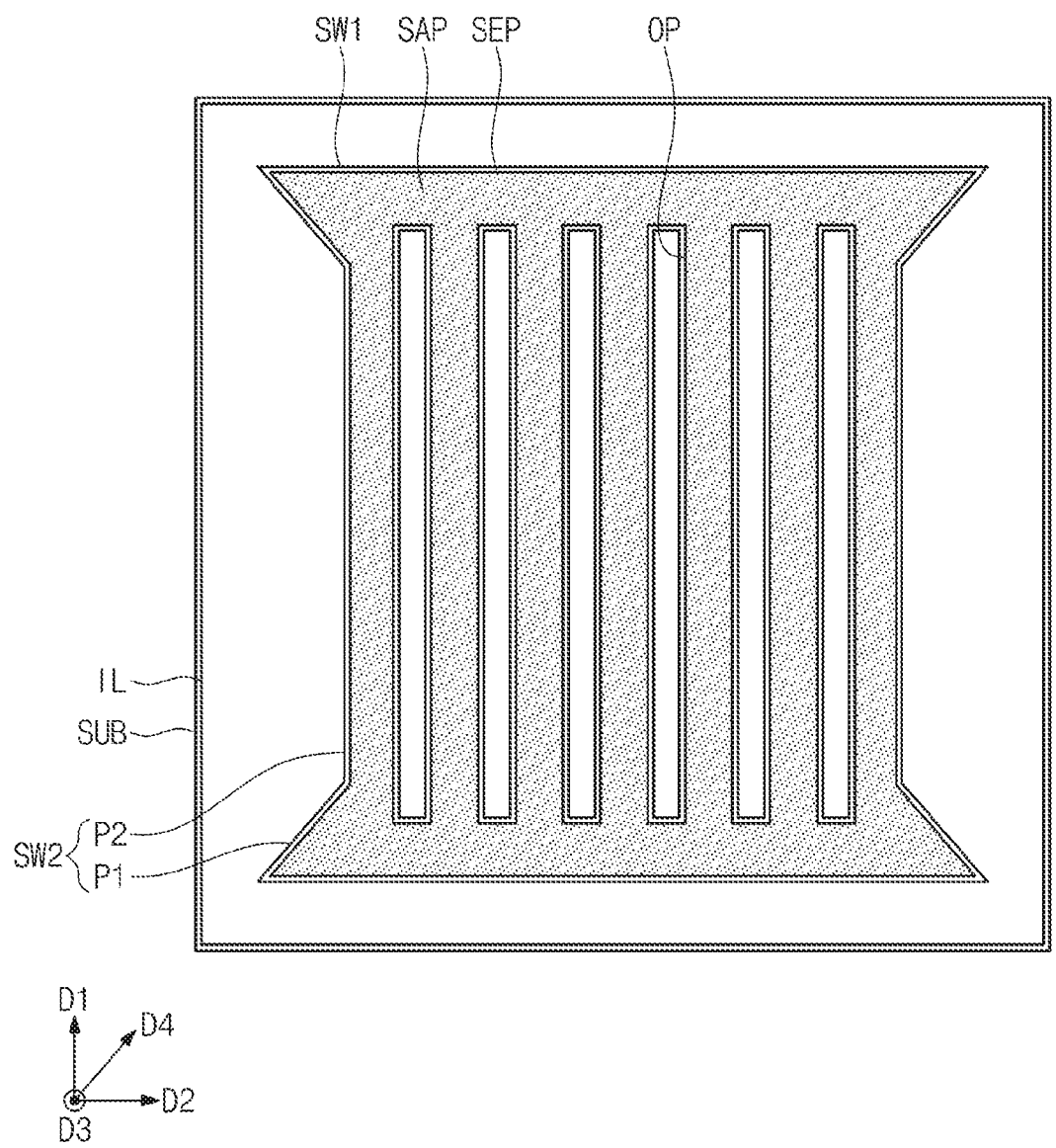
FIGS. 27 and 28 illustrate plan views showing a method of fabricating a light emitting device according to some example embodiments of the present inventive concepts.
Figure 28:
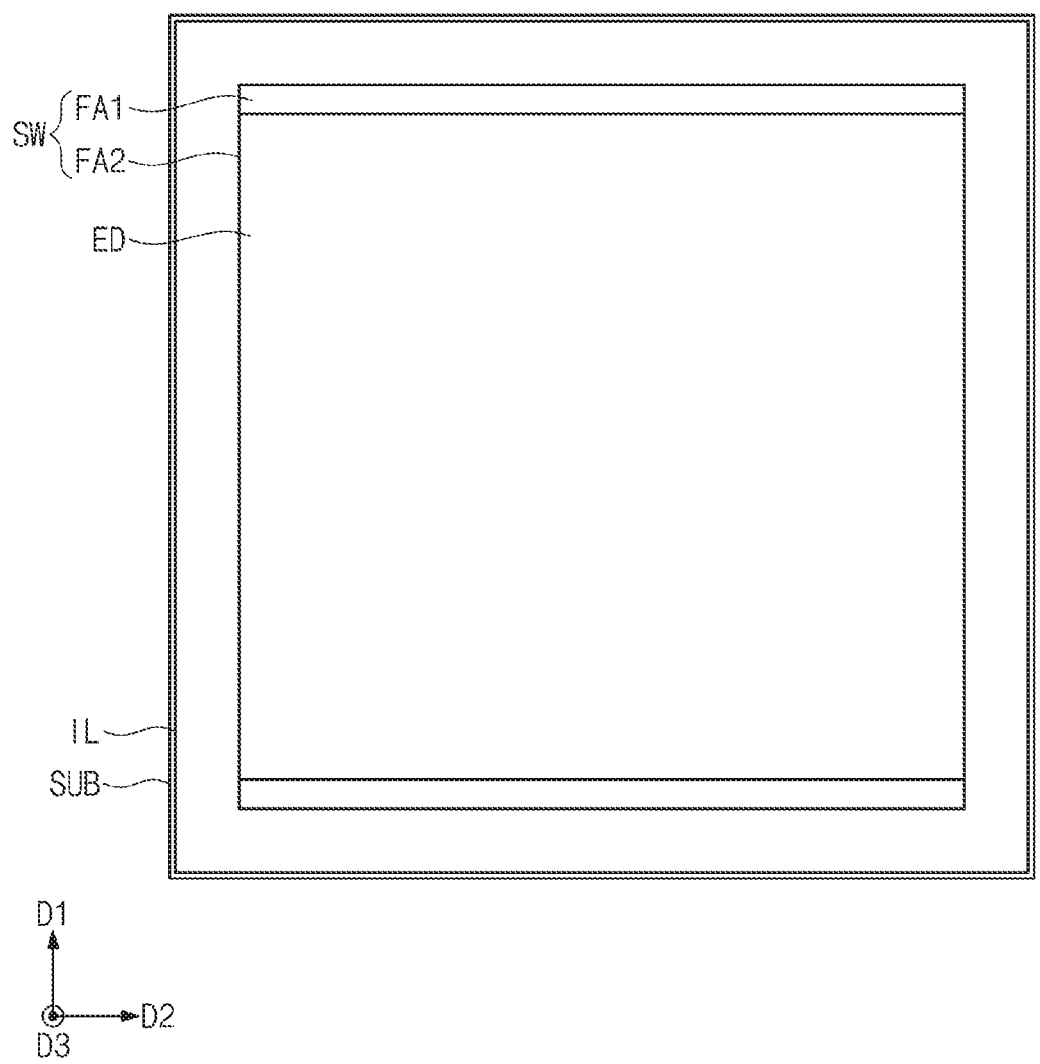

FIGS. 27 and 28 illustrate plan views showing a method of fabricating a light emitting device according to some example embodiments of the present inventive concepts. In the embodiment that follows, a detailed description of technical features repetitive to those of the fabrication method discussed above with reference to FIGS. 7 to 15D will be omitted, and a difference thereof will be discussed in detail.

Referring to FIG. 27, the sacrificial pattern SAP may be formed on the substrate SUB. The sacrificial pattern SAP may be formed to have a plurality of openings OP extending in the first direction D1. The inorganic layer IL may be conformally formed on the entire surface of the substrate SUB. The inorganic layer IL may include the seed pattern SEP covering the sacrificial pattern SAP.

Referring to FIG. 28, the sacrificial pattern SAP may be selectively removed. The seed pattern SEP may undergo a selective epitaxial growth process to form the light emitting device ED. The light emitting device ED may have a size greater than that of the light emitting device ED shown in FIG. 13.

Figure 29:
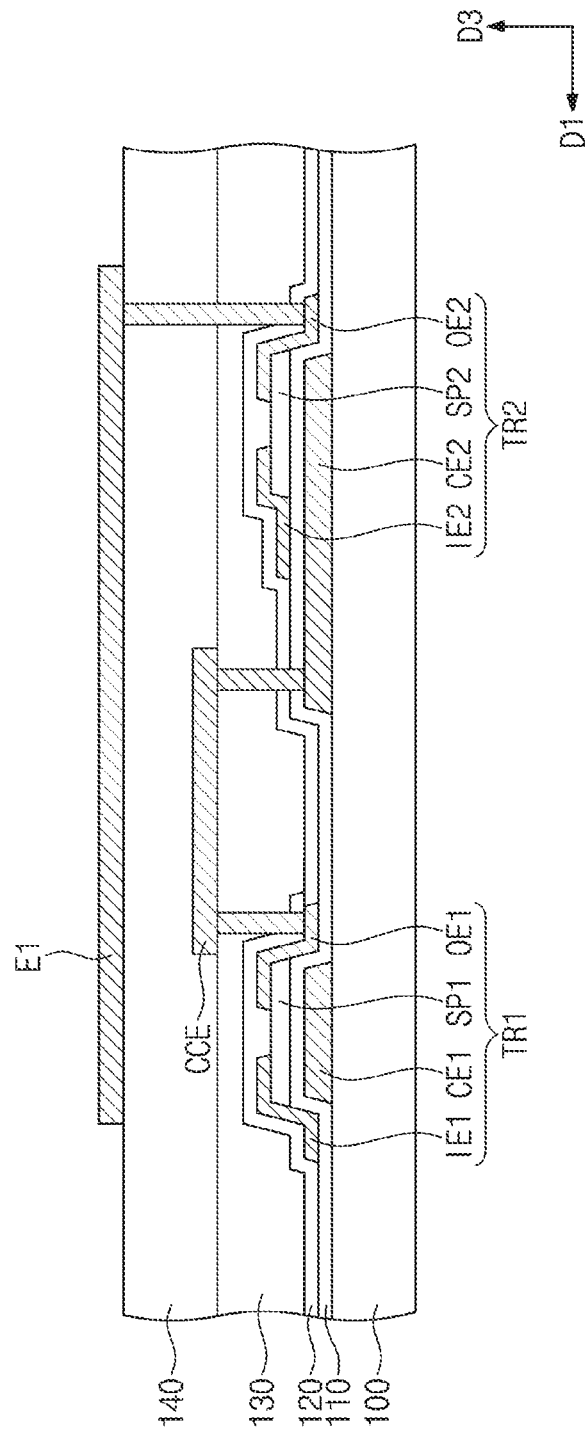
FIGS. 29, 30, and 31 illustrate cross-sectional views showing a method of fabricating a display apparatus according to some example embodiments of the present inventive concepts.
Figure 30:
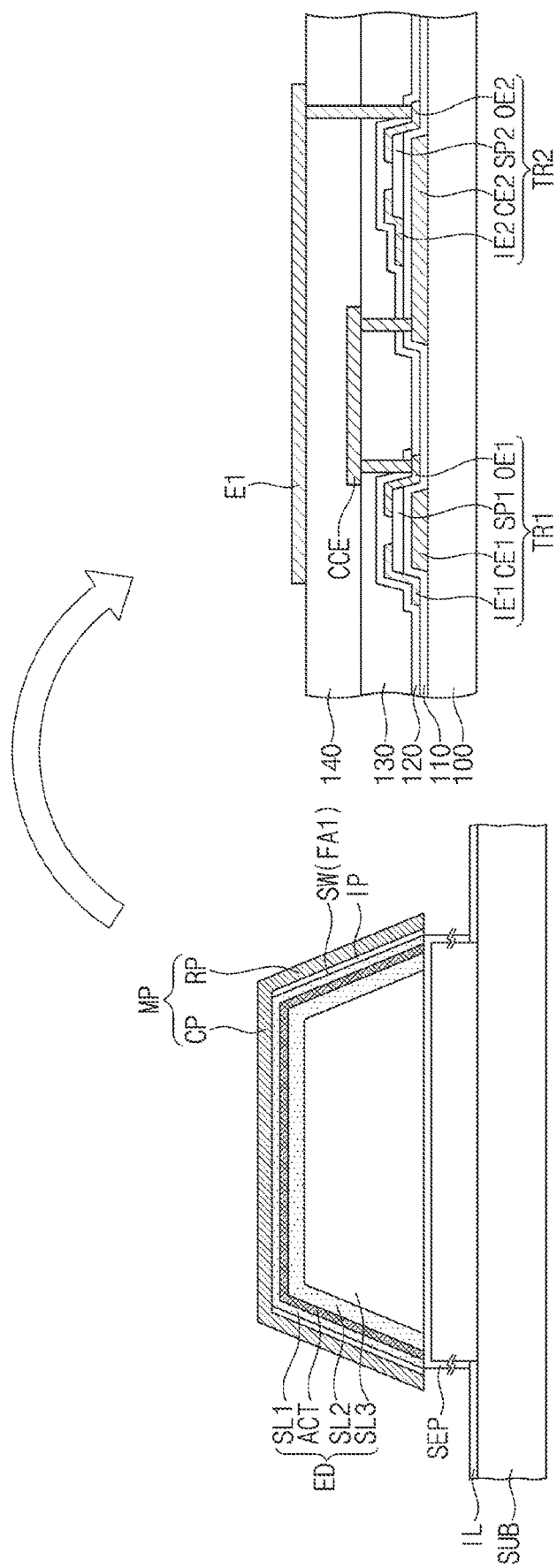
Figure 31:
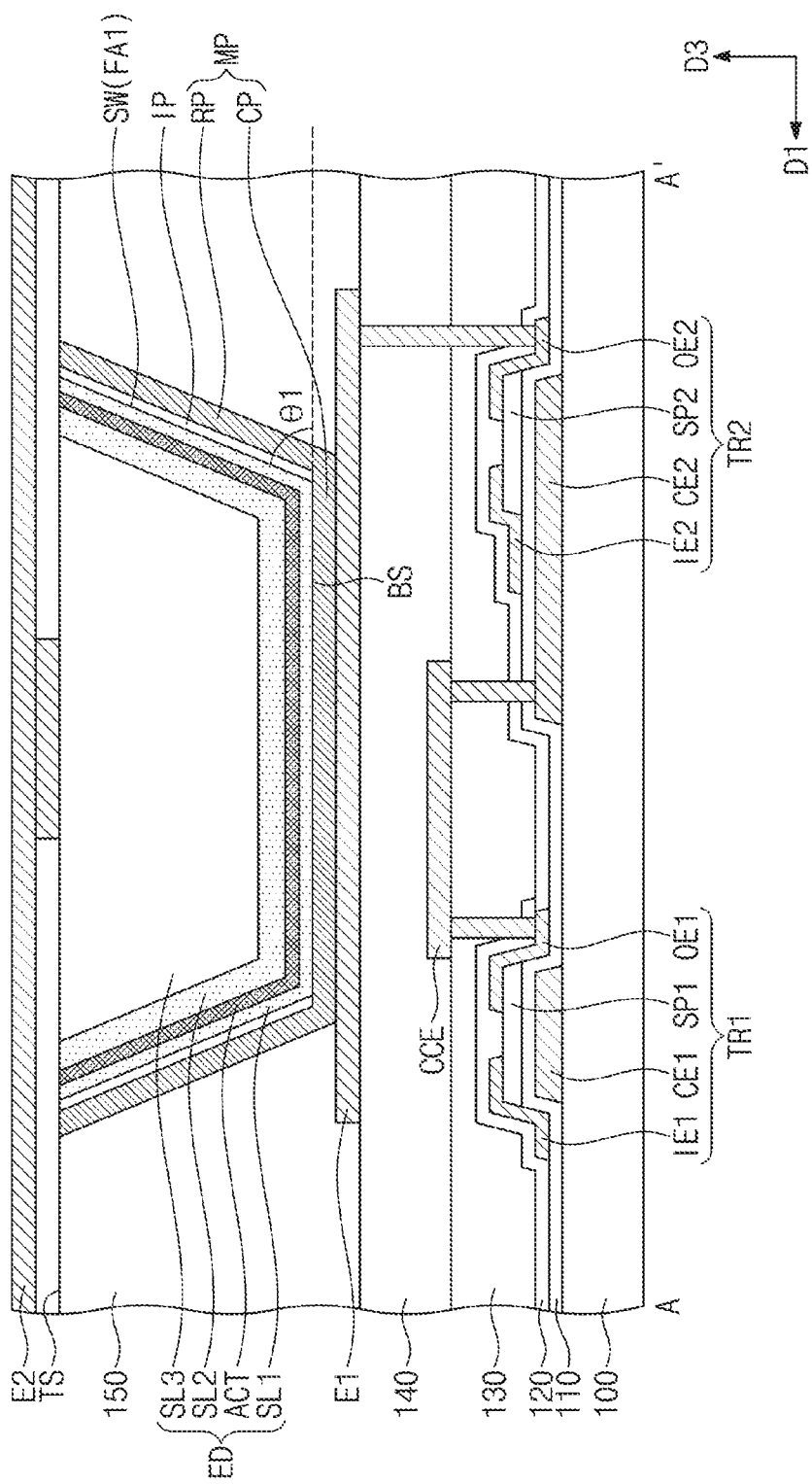

FIGS. 29, 30, and 31 illustrate cross-sectional views showing a method of fabricating a display apparatus according to some example embodiments of the present inventive concepts.

Referring to FIG. 29, a first thin film transistor TR1 and a second thin film transistor TR2 may be formed on a base layer 100. The formation of the first and second thin film transistors TR1 and TR2 may include performing a low temperature polycrystalline silicon (LTPS) process or a low temperature polycrystalline oxide (LTPO) process. A connection electrode CCE may be formed to electrically connect the first and second thin film transistors TR1 and TR2 to each other. A first electrode E1 may be formed on the connection electrode CCE. The first electrode E1 may be electrically connected to the second thin film transistor TR2. The first electrode E1 may be externally exposed.

Referring to FIG. 30, an insulation pattern IP and a conductive structure MP may be formed on the light emitting device ED discussed above with reference to FIGS. 13, 14A, and 14B.

The insulation pattern IP may be formed to selectively cover the sidewall SW of the light emitting device ED. For example, the formation of the insulation pattern IP may include conformally forming a dielectric layer on a surface of the light emitting device ED and anisotropically etching the dielectric layer until a top surface of the light emitting device ED is exposed.

The formation of the conductive structure MP may include forming a metal layer on the light emitting device ED and the insulation pattern IP. For example, the conductive structure MP may include a stacked layer of nickel/gold. The connection pattern CP of the conductive structure MP may directly contact the light emitting device ED. The reflection pattern RP of the conductive structure MP may be spaced apart from the light emitting device ED across the insulation pattern IP.

The light emitting device ED may be separated from the seed pattern SEP and the substrate SUB. A mechanical lift-off technique may be used to separate the light emitting device ED.

The separated light emitting device ED may be mounted on the first electrode E1. The separated light emitting device ED may be turned upside down to allow the connection pattern CP of the conductive structure MP to lie on the first electrode E1.

Referring to FIG. 31, a fifth dielectric layer 150 may be formed to cover the first electrode E1 and the conductive structure MP. A second electrode E2 may be formed on the fifth dielectric layer 150. The second electrode E2 may be electrically connected to the third semiconductor layer SL3 of the light emitting device ED.

Referring back to FIGS. 3, 4A, and 4B, a light shield pattern BM and a color filter CF may be formed on the second electrode E2. The light shield pattern BM may be a black matrix. The color filter CF may include one or more of a red color filter, a green color filter, and a blue color filter. A cover layer CV may be formed on the light shield pattern BM and the color filter CF.

Figure 32:
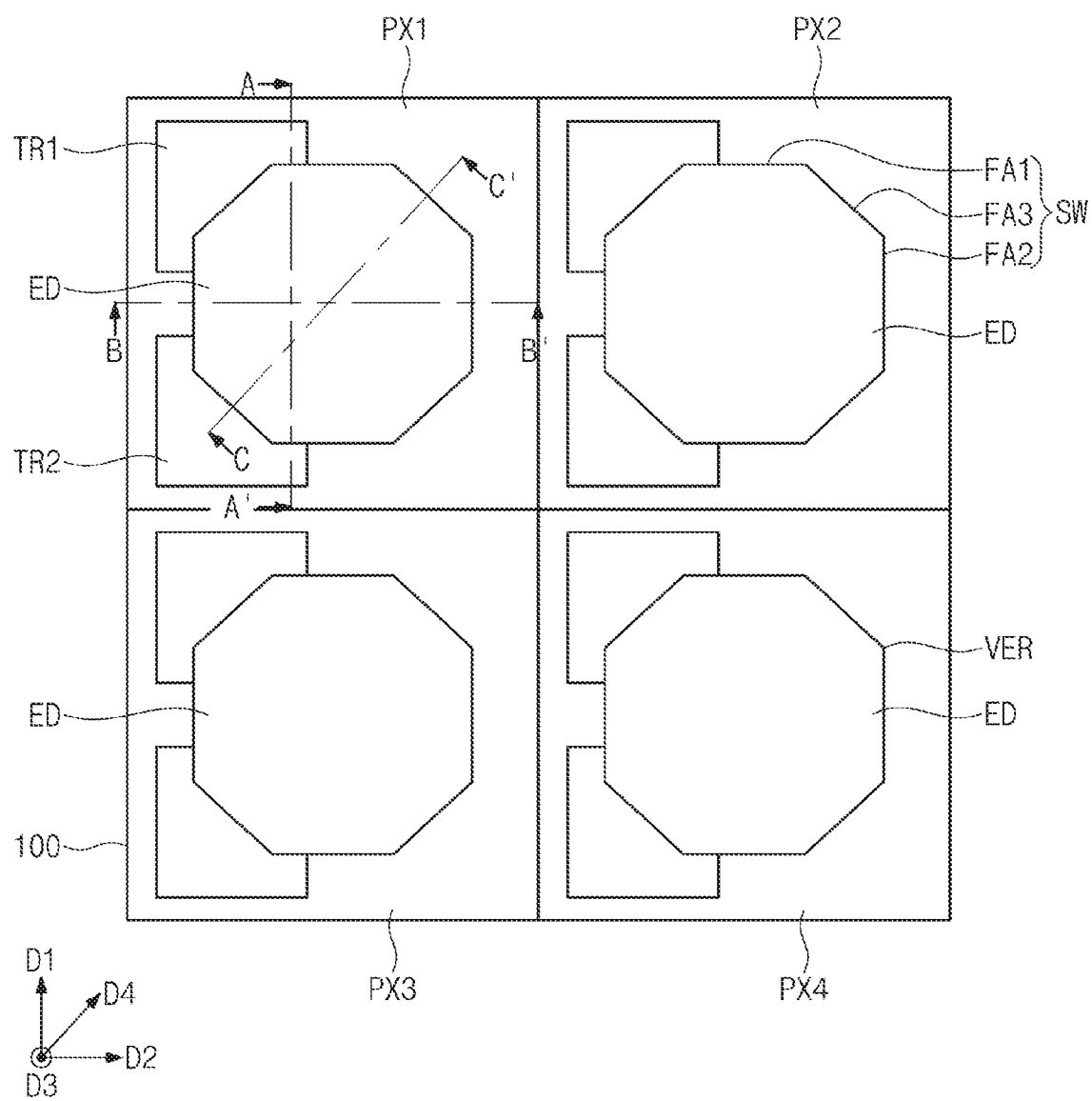
FIG. 32 illustrates a plan view showing a display panel of a display apparatus according to some example embodiments of the present inventive concepts.
Figure 33:
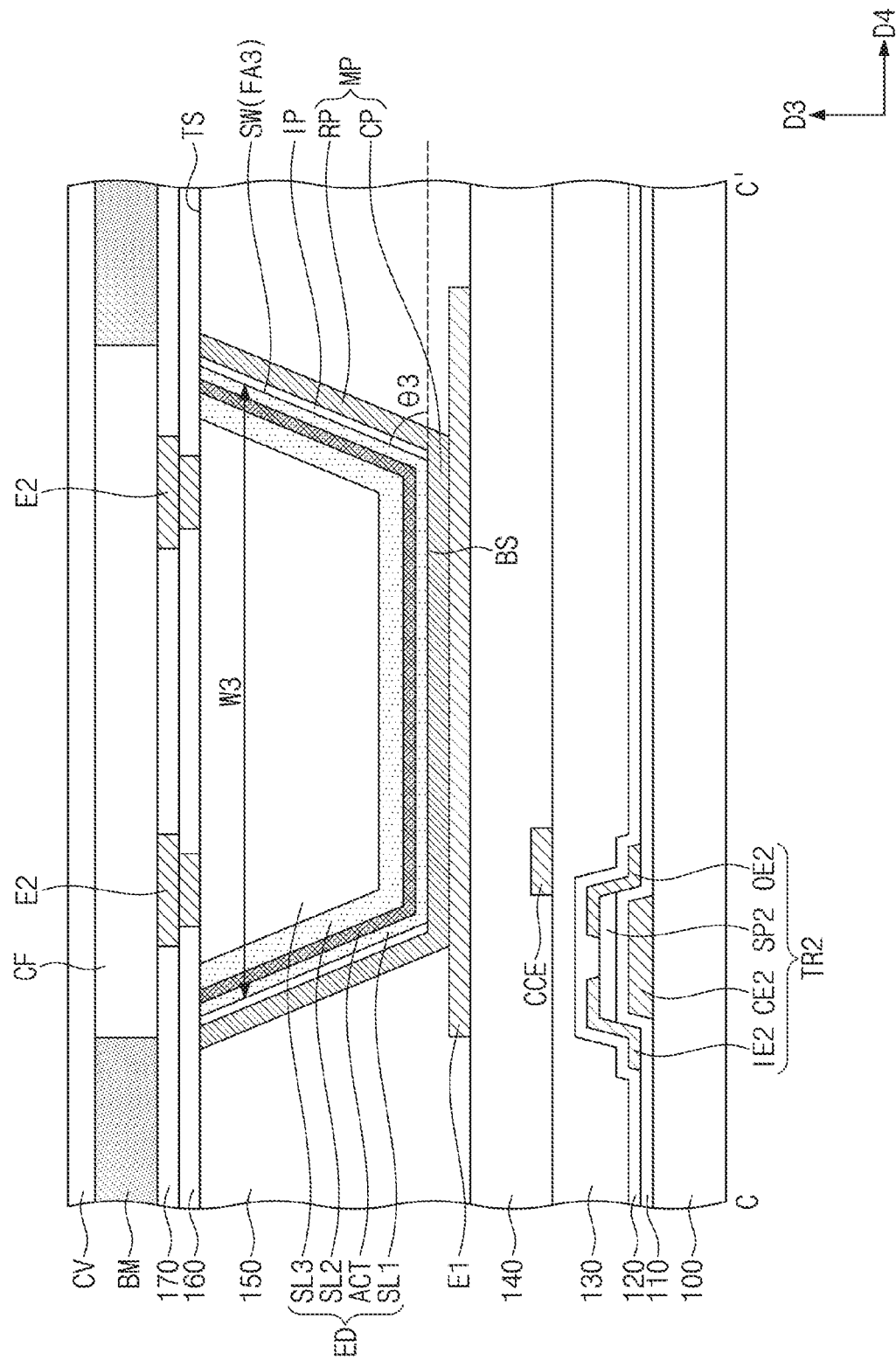
FIG. 33 illustrates a cross-sectional view taken along line C-C' of FIG. 32.

FIG. 32 illustrates a plan view showing a display panel of a display apparatus according to some example embodiments of the present inventive concepts. FIG. 33 illustrates a cross-sectional view taken along line C-C' of FIG. 32. FIG. 4A may be substantially the same as the cross-sectional view taken along line A-A' of FIG. 32. FIG. 4B may be substantially the same as the cross-sectional view taken along line B-B' of FIG. 32. In the embodiment that follows, a detailed description of technical features repetitive to those of the display apparatus discussed above with reference to FIGS. 3, 4A, 4B, and 5 will be omitted, and a difference thereof will be discussed in detail.

Referring to FIGS. 32, 33, 4A, and 4B, the sidewall SW of the light emitting device ED may include the first facet FA1 and the second facet FA2, and further include the third facet FA3. For example, a display apparatus according to the present embodiment may include the light emitting device ED fabricated by the method discussed above with reference to FIGS. 16 and 17.

The third facet FA3 may be interposed between the first facet FA1 and the second facet FA2. The third facet FA3 may be a semi-polar plane that is inclined to the top surface TS and the bottom surface BS of the light emitting device ED. The third facet FA3 may make an angle θ3 of 10° to 80° with the bottom surface BS. For example, the angle θ3 made between the third facet FA3 and the bottom surface BS may be substantially the same as the angle θ1 made between the first facet FA1 and the bottom surface BS shown in FIG. 4A. For another example, the angle θ3 made between the third facet FA3 and the bottom surface BS may be different from the angle θ1 made between the first facet FA1 and the bottom surface BS shown in FIG. 4A. The angle θ3 made between the third facet FA3 and the bottom surface BS may be less than the angle θ2 made between the second facet FA2 and the bottom surface BS shown in FIG. 4B.

The first facet FA1 and the third facet FA3 may be adjacent to each other. The first facet FA1 and the third facet FA3 may meet each other to define the edge VER on the sidewall SW of the light emitting device ED. The second facet FA2 and the third facet FA3 may be adjacent to each other. The second facet FA2 and the third facet FA3 may meet each other to define the edge VER on the sidewall SW of the light emitting device ED.

The inclined third facet FA3 may cause the light emitting device ED to have a cross section shaped like an inverted pyramid in the fourth direction D4. For example, the light emitting device ED may have a width W3 in the fourth direction D4 that increases with increasing distance from the base layer 100.

Figure 34:
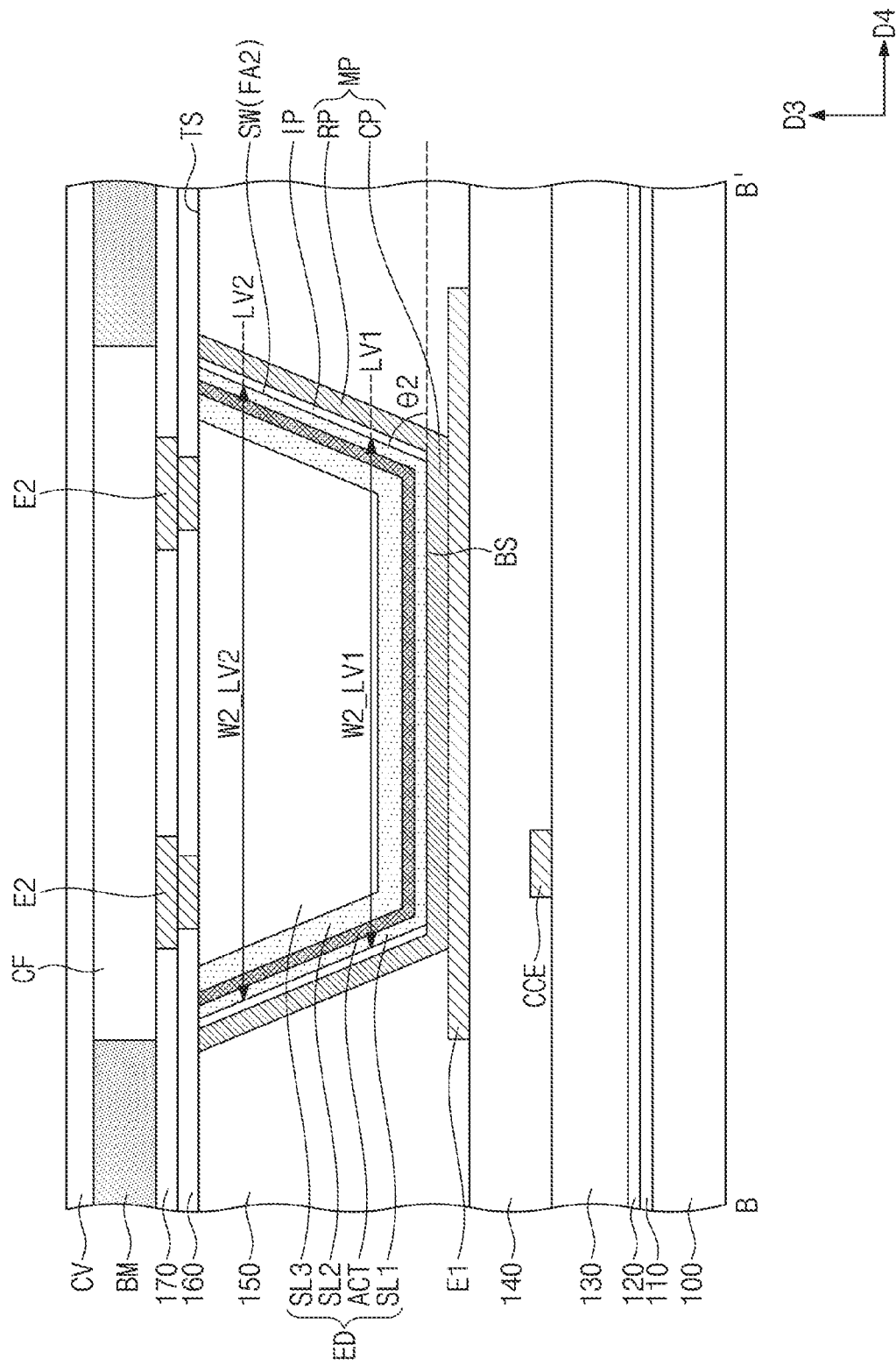
FIG. 34 illustrates a cross-sectional view taken along line B-B' of FIG. 3, showing a display apparatus according to some example embodiments of the present inventive concepts.

FIG. 34 illustrates a cross-sectional view taken along line B-B' of FIG. 3, showing a display apparatus according to some example embodiments of the present inventive concepts. In the embodiment that follows, a detailed description of technical features repetitive to those of the display apparatus discussed above with reference to FIGS. 3, 4A, 4B, and 5 will be omitted, and a difference thereof will be discussed in detail.

Referring to FIGS. 3, 4A, and 34, the sidewall SW of the light emitting device ED may include the first facet FA1 and the second facet FA2. The second facet FA2 may be a semi-polar plane. The second facet FA2 may make an angle θ2 of about 10° to 80° with the bottom surface BS. For example, the angle θ2 made between the second facet FA2 and the bottom surface BS may be substantially the same as the angle θ1 made between the first facet FA1 and the bottom surface BS.

The light emitting device ED may have a second width W2_LV1 at the first level LV1 less than a second width W2_LV2 at the second level LV2. A second difference between the second width W2_LV2 at the second level LV2 and the second width W2_LV1 at the first level LV1 may be substantially the same as a first difference between the first width W1_LV2 at the second level LV2 and the first width W1_LV1 at the first level LV1.

According to some example embodiments of the present inventive concepts, a light emitting device may increase in luminance efficiency. In a method of fabricating a display apparatus according to some example embodiments of the present inventive concepts, the shape of a seed pattern may be adjusted to easily fabricate a light emitting device having a desired shape.

What is claimed is:

1. A display apparatus, comprising:
a plurality of pixels; and
a light emitting device on each of the plurality of pixels, wherein
the light emitting device includes a first semiconductor layer, an active layer, and a second semiconductor layer that are sequentially stacked on a bottom surface and a sidewall of the light emitting device,
the sidewall of the light emitting device includes a first facet, a second facet adjacent to the first facet, and a third facet adjacent to the second facet, the second facet being between the first facet and the third facet,
the first facet is an (n−n 0 k) plane, each of n and k is an integer equal to or greater than 1,
the second facet is a crystal plane having a Miller index different from that Miller index of the first facet,
the third facet is a crystal plane having a Miller index different from the Miller index of the first facet,
a first angle is made between the bottom surface and the first facet,
a second angle is made between the bottom surface and the second facet,
a third angle is made between the bottom surface and the third facet,
the first angle is less than the second angle,
the third angle is less than the second angle,
the first angle is different from the third angle,
the first facet and the second facet meet each other to define a first edge, the second facet and the third facet meet each other to define a second edge, and
the first and second edges extends from the bottom surface toward a top surface of the light emitting device.

2. The display apparatus of claim 1, wherein the second angle is about 90°.

3. The display apparatus of claim 1, wherein the light emitting device includes one or more of GaN, AN, AlGaN, InGaN, InN, InAlGaN, AlInN, and a combination thereof.

4. The display apparatus of claim 1, further comprising:
a first electrode electrically connected to the bottom surface of the light emitting device; and
a second electrode electrically connected to the top surface of the light emitting device.

5. The display apparatus of claim 1, further comprising:
a first electrode electrically connected to the bottom surface of the light emitting device;
a contact plug penetrating the light emitting device and contacting the second semiconductor layer of the light emitting device; and
a second electrode connected to the contact plug.

6. The display apparatus of claim 1, further comprising:
a conductive structure including a reflection pattern on the sidewall and a connection pattern on the bottom surface; and an insulation pattern between the sidewall and the reflection pattern.

7. A display apparatus, comprising:
a plurality of pixels;
a light emitting device on each of the plurality of pixels; and
a conductive layer including a reflective portion on a sidewall of the light emitting device and a connecting portion on a bottom surface of the light emitting device;
a first electrode on the connecting portion covering the bottom surface of the light emitting device; and
a second electrode on a top surface of the light emitting device, wherein
the reflective portion extends from the connecting portion toward the top surface of the light emitting device,
the light emitting device includes a first semiconductor layer, an active layer, and a second semiconductor layer that are sequentially stacked on the bottom surface and the sidewall,
the portion is spaced apart from the first semiconductor layer,
the connecting portion directly contacts the first semiconductor layer, thereby connecting the first electrode to the first semiconductor layer,
the sidewall of the light emitting device includes a first facet and a second facet adjacent to the first facet,
the first facet is an (n–n 0 k) plane, each of n and k is an integer equal to or greater than 1, and
the second facet is a crystal plane having a Miller index different from the Miller index of the first facet.

8. The display apparatus of claim 7, wherein
a first angle is made between the bottom surface and the first facet,
a second angle is made between the bottom surface and the second facet,
the first angle is different from the second angle, and
the first facet and the second facet meet each other to define an edge.

9. The display apparatus of claim 8, wherein the first angle is less than the second angle.

10. The display apparatus of claim 7, further comprising an insulation pattern between the sidewall and the reflective portion, wherein the reflective portion is spaced apart from the sidewall across the insulation pattern.

11. The display apparatus of claim 7, wherein the light emitting device includes one or more of GaN, AN, AlGaN, InGaN, InN, InAlGaN, AlInN, and a combination thereof.

12. The display apparatus of claim 7, further comprising:
a first electrode electrically connected through the connecting portion to the light emitting device; and
a second electrode electrically connected to a top surface of the light emitting device.

13. The display apparatus of claim 7, further comprising:
a first electrode electrically connected through the connecting portion to the light emitting device; and
a contact plug penetrating the light emitting device and contacting the second semiconductor layer of the light emitting device; and
a second electrode connected to the contact plug.

14. A display apparatus, comprising:
a plurality of pixels on a base layer;
a light emitting device on each of the plurality of pixels;
a first electrode electrically connected to a bottom surface of the light emitting device; and
a second electrode electrically connected to a top surface of the light emitting device,
wherein the light emitting device consists of a first semiconductor layer having an n-type, an active layer, a second semiconductor layer having a p-type, and a third semiconductor layer that are sequentially stacked,
the light emitting device has a first width in a first direction at a first level and a second width in the first direction at a second level higher than the first level,
the light emitting device has a third width in a second direction at the first level and a fourth width in the second direction at the second level, the second direction intersecting the first direction,
a first difference between the second width and the first width is greater than a second difference between the fourth width and the third width,
the light emitting device has a truncated inverted pyramid structure in which an area of the top surface is greater than an area of the bottom surface,
a width of the light emitting device in the first direction gradually increases from the bottom surface to the top surface,
each of the top and bottom surfaces of the light emitting device is a c-plane,
the first electrode is electrically connected to the first semiconductor layer through the bottom surface, and
the second electrode is electrically connected to the third semiconductor layer through the top surface.

15. The display apparatus of claim 14, further comprising a reflection pattern on a sidewall of the light emitting device, wherein the active layer is spaced apart from the reflection pattern across the first semiconductor layer.

16. The display apparatus of claim 14, wherein the first, second and third semiconductor layer include GaN.

17. The display apparatus of claim 14, wherein the first width is smaller than the second width, and the third width is substantially the same with the fourth width.

\* \* \* \* \*